US011424140B2

(12) United States Patent
Kim et al.

(10) Patent No.: US 11,424,140 B2
(45) Date of Patent: Aug. 23, 2022

(54) MEMBER, METHOD OF MANUFACTURING THE SAME, APPARATUS FOR MANUFACTURING THE SAME, AND SEMICONDUCTOR MANUFACTURING APPARATUS

(71) Applicant: SAMSUNG ELECTRONICS CO., LTD., Suwon-si (KR)

(72) Inventors: Changhwan Kim, Suwon-si (KR); Toshihiro Iizuka, Kanagawa Pref (JP); Kenichi Nagayama, Kanagawa Pref (JP); Takafumi Noguchi, Kanagawa Pref (JP)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/035,023

(22) Filed: Sep. 28, 2020

(65) Prior Publication Data

US 2021/0111044 A1    Apr. 15, 2021

(30) Foreign Application Priority Data

Oct. 10, 2019   (JP) ............................. JP2019-187126
Apr. 29, 2020   (KR) ........................ 10-2020-0052459

(51) Int. Cl.
| | | |
|---|---|---|
| *B05C 15/00* | (2006.01) | |
| *B05C 19/00* | (2006.01) | |
| *H01L 21/67* | (2006.01) | |
| *B05D 1/12* | (2006.01) | |
| *B05B 7/14* | (2006.01) | |

(52) U.S. Cl.
CPC .......... *H01L 21/67069* (2013.01); *B05B 7/14* (2013.01); *B05C 15/00* (2013.01); *B05C 19/008* (2013.01); *B05D 1/12* (2013.01)

(58) Field of Classification Search
USPC .................................................. 118/308, 309
See application file for complete search history.

(56) References Cited

U.S. PATENT DOCUMENTS

| | | | | |
|---|---|---|---|---|
| 8,986,829 | B2 * | 3/2015 | Akedo ..................... | C23C 26/00 428/332 |
| 2005/0147343 | A1 * | 7/2005 | Nakada .................. | G02B 6/132 385/14 |
| 2008/0274347 | A1 * | 11/2008 | Iwasawa ................. | C23C 24/04 428/323 |
| 2013/0306989 | A1 * | 11/2013 | Kub .................. | H01L 21/02527 257/77 |
| 2016/0300865 | A1 * | 10/2016 | Yamazaki ......... | H01L 29/78675 |
| 2016/0307740 | A1 | 10/2016 | Kim et al. | |

(Continued)

FOREIGN PATENT DOCUMENTS

| | | |
|---|---|---|
| JP | 2017-150083 | 8/2017 |
| JP | 2018-046278 | 3/2018 |

(Continued)

*Primary Examiner* — Yewebdar T Tadesse
(74) *Attorney, Agent, or Firm* — F. Chau & Associates, LLC

(57) ABSTRACT

A member includes a base material structure and a surface layer on the base material structure. The surface layer includes a particle that includes Y—O—F. The base material structure includes interface layers in contact with the surface layer. The interface layers of the base material structure include fluorine.

6 Claims, 29 Drawing Sheets

(56) References Cited

U.S. PATENT DOCUMENTS

| | | | |
|---|---|---|---|
| 2017/0277219 A1* | 9/2017 | Chung | H01L 27/326 |
| 2017/0342539 A1 | 11/2017 | Sato et al. | |
| 2018/0330923 A1 | 11/2018 | Tran et al. | |
| 2019/0027343 A1 | 1/2019 | Nitta | |
| 2019/0348291 A1* | 11/2019 | Park | C23C 24/04 |
| 2020/0095687 A1* | 3/2020 | Park | C23C 24/06 |

FOREIGN PATENT DOCUMENTS

| | | | |
|---|---|---|---|
| JP | 2018-190983 | 11/2018 | |
| KR | 101322783 B1 * | 9/2013 | |
| WO | WO-2018217062 A1 * | 11/2018 | C01F 17/259 |

* cited by examiner

FIG. 3

```
START
  ↓
FIX POSTURE AND POSITION OF NOZZLE OR
SUBSTRATE                              — ST1
  ↓
MIX RAW MATERIAL POWDER AND GAS        — ST2
  ↓
SPRAY AEROSOL                          — ST3
  ↓
END
```

MEMBER, METHOD OF MANUFACTURING THE SAME, APPARATUS FOR MANUFACTURING THE SAME, AND SEMICONDUCTOR MANUFACTURING APPARATUS

CROSS-REFERENCE TO RELATED APPLICATION

This application claims priority under 35 USC § 119 from, and the benefit of, Japanese Patent Application No. 2019-187126, filed on Oct. 10, 2019 in the Japan Patent Office (JPO), and Korean Patent Application No. 10-2020-0052459, filed on Apr. 29, 2020 in the Korean Intellectual Property Office (KIPO), the contents of both of which are herein incorporated by reference in their entireties.

BACKGROUND

1. Technical Field

Exemplary embodiments are directed to a surface layer, a method of manufacturing the same, an apparatus for manufacturing the same, and a semiconductor manufacturing apparatus, and more particularly, to a material; structure that includes a base material structure and the surface layer thereon, a method of manufacturing the material structure, an apparatus for manufacturing the material structure, and a semiconductor manufacturing apparatus.

2. Discussion of the Related Art

A structure disclosed in Japanese Patent Publication No. 2018-082154 includes a yttrium oxyflouride (Y—O—F) polycrystal that has a rhombohedral crystal structure as a main element, and an average crystallite size of the polycrystal is less than 100 nanometers. Denoting a peak intensity detected by X-ray diffraction at an angle of diffraction near 2θ=32.0° by γ, and a peak intensity detected at an angle of diffraction near 2θ=32.8° by δ, a peak intensity ratio γ/δ is above 0% and below 150% P.

This structure can be formed directly on a base material structure by an aerosol deposition process, and has good plasma tolerance. Thus, this structure serves as a surface layer on a base material structure, and increases the plasma tolerance.

Y—O—F has a fracture toughness less than those of materials used in an aerosol deposition process. Thus, even though particles that include Y—O—F are spouted onto a base material structure by an aerosol deposition process, a green compact may form, which can easily separate from the base material structure.

SUMMARY

Exemplary embodiments provide a method of forming a surface layer having good plasma tolerance on a base material structure.

According to exemplary embodiments, there is provided a member. The member includes a base material structure, and a surface layer on the base material structure. The surface layer includes a particle that includes Y—O—F, the base material structure includes an interface layer in contact with the surface layer, and the interface layer of the base material structure includes fluorine.

Fluorine may move near an interface between the surface layer and the base material structure, and atoms may be mixed therein. Accordingly, an adhesion between the surface layer and the base material structure may be good. That is, the surface layer having good plasma tolerance may be stably formed on the base material structure.

In exemplary embodiments, the base material structure includes a base body in contact with the interface layer thereof, the interface layer of the base material structure includes a first layer and a second layer, wherein the second layer is closer to the base body than the first layer, and the second layer has a fluorine content that is greater than that of the first layer.

Atoms may be mixed near the interface between the surface layer and the base material structure. Thus, the adhesion between the surface layer and the base material structure may be increased. That is, the surface layer having good plasma tolerance may be stably formed on the base material structure.

In exemplary embodiments, an X-ray diffraction peak intensity ratio of a (1 5 1) plane with respect to a (1 0 0) plane of the surface layer is greater than an X-ray diffraction peak intensity ratio of a (1 5 1) plane with respect to a (1 0 0) plane of a raw material powder of the surface layer or of ICDD data of a raw material.

In exemplary embodiments, the surface layer has a crystalline orientation that is greater than that of the raw material powder. Thus, the surface layer may have good plasma tolerance.

In exemplary embodiments, the particle that includes Y—O—F has an average diameter of about 10 nm to about 100 nm, and the surface layer has a porosity of equal to or less than about 2%.

The surface layer may be filled with the particles that include Y—O—F. Thus, the surface layer may have good plasma tolerance.

In exemplary embodiments, the Y—O—F has a rhombohedral crystal structure that includes one of $Y_5O_4F_7$, $Y_1O_{0.826}F_{1.348}$, $Y_6O_5F_8$, $Y_7O_6F_9$, or $Y_{17}O_{14}F_{23}$. Thus, the surface layer may have good plasma tolerance.

In exemplary embodiments, the base material structure includes one of a ceramic, a metal, a glass, or an organic compound.

The adhesion between the base material structure and the surface layer may be stabilized. That is, the surface layer may be stably formed on the base material structure having good plasma tolerance.

According to exemplary embodiments, there is provided a method of manufacturing a member. In the method, a raw material powder that includes a plurality of raw material particles is sprayed through a nozzle onto a base material structure that includes a plane so that a surface layer is formed on the plane of the base material structure. A particle incident angle formed by a spray axis of the raw material powder and the plane of the base material structure is equal to or less than 30 degrees.

In exemplary embodiments, an average velocity of the raw material particles being sprayed from the nozzle is equal to or less than 60 m/sec.

In exemplary embodiments, the raw material powder includes Y—O—F that has a rhombohedral crystal structure that includes one of $Y_5O_4F_7$, $Y_1O_{0.826}F_{1.348}$, $Y_6O_5F_8$, $Y_7O_6F_9$, or $Y_{17}O_{14}F_{23}$.

In exemplary embodiments, the method further includes fixing a posture and position of one of the nozzle or the base material structure; and mixing the raw material powder and nitrogen gas in an enclosed space wherein an aerosol is generated, wherein the raw material powder sprayed through the nozzle is aerosolized.

According to exemplary embodiments, there is provided a manufacturing apparatus for a member. The manufacturing apparatus includes a chamber that holds a base material structure that includes a planar surface, and a nozzle disposed in the chamber that is open inside of the chamber. The nozzle sprays a raw material powder onto the planar surface so that a surface layer is formed on the planar surface, and a particle incident angle formed by a spray axis of the raw material powder and the planar surface is equal to or less than 30 degrees.

According to exemplary embodiments, the surface layer includes a particle that includes Y—O—F, the base material structure includes an interface layer in contact with the surface layer, and the interface layer of the base material structure includes fluorine.

According to exemplary embodiments, the base material structure includes a base body in contact with the interface layer thereof, the interface layer of the base material structure includes a first layer and a second layer, where the second layer is closer to the base body than the first layer, and the second layer has a fluorine content that is greater than that of the first layer.

According to exemplary embodiments, the base an X-ray diffraction peak intensity ratio of a (1 5 1) plane with respect to a (1 0 0) plane of the surface layer is greater than an X-ray diffraction peak intensity ratio of a (1 5 1) plane with respect to a (1 0 0) plane of a raw material powder of the surface layer or of ICDD data of a raw material.

According to exemplary embodiments, the surface layer has a crystalline orientation greater than that of the raw material powder.

According to exemplary embodiments, the particle that includes Y—O—F has an average diameter from about 10 nm to about 100 nm, and the surface layer has a porosity of equal to or less than about 2%.

According to exemplary embodiments, the Y—O—F has a rhombohedral crystal structure that includes one of $Y_5O_4F_7$, $Y_1O_{0.826}F_{1.348}$, $Y_6O_5F_8$, $Y_7O_6F_9$, or $Y_{17}O_{14}F_{23}$.

According to exemplary embodiments, the base material structure includes one of a ceramic, a metal, a glass, or an organic compound.

According to exemplary embodiments, the surface layer may be stably formed on the base material structure having good plasma tolerance.

BRIEF DESCRIPTION OF THE DRAWINGS

FIG. 3 is a flowchart illustrating a method of manufacturing a surface layer in accordance with exemplary embodiments.

DESCRIPTION OF EMBODIMENTS

Hereinafter, exemplary embodiments will be described with reference to FIG. 1.

Figure 1:
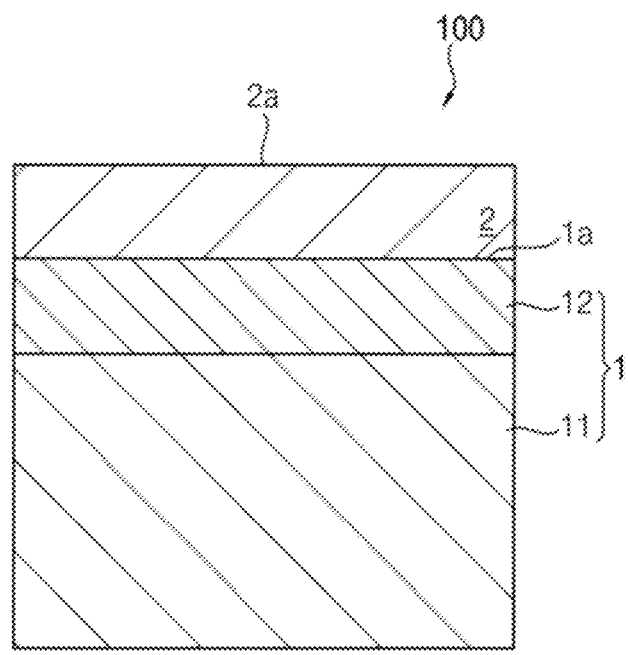
FIG. 1 is a cross-sectional view of a surface layer in accordance with exemplary embodiments.

As shown in FIG. 1, a member 100 may include a base material structure 1 and a surface layer 2. The surface layer 2 is formed on a surface 1a of the base material structure 1.

In an embodiment, the base material structure 1 includes a base material body 11 and an interface layer 12. The interface layer 12 of the base material structure 1 contacts the surface layer 2, and may include fluorine.

In an embodiment, the surface layer 2 includes yttrium oxyflouride (Y—O—F), and has good plasma tolerance. Surface layer 2 has a surface 2a opposite of surface 1a that covers the member 100.

In an embodiment, the surface layer 2 includes Y—O—F, and has good plasma tolerance. In addition, the interface layer 12 of the base material structure 1 includes fluorine. Thus, fluorine atoms can diffuse near an interface between the surface layer 2 and the base material structure 1, and atoms can be mixed near the interface therebetween. Accordingly, a bonding intensity between the surface layer 2 and the base material structure 1 is strong. That is, the surface layer 2 that has good plasma tolerance can be stably formed on the base material structure 1.

In an embodiment, the member 100 can be used as an element of a semiconductor device. When the member 100 is used as an element of a semiconductor device, it shows good plasma tolerance. Thus, the member 100 can be used as an element of a semiconductor device.

Hereinafter, an embodiment will be described with reference to FIG. 2. A member according to an embodiment has a structure substantially the same as that of the member 100 according to exemplary embodiments illustrated above, except for the interface layer of the base material structure.

Figure 2:
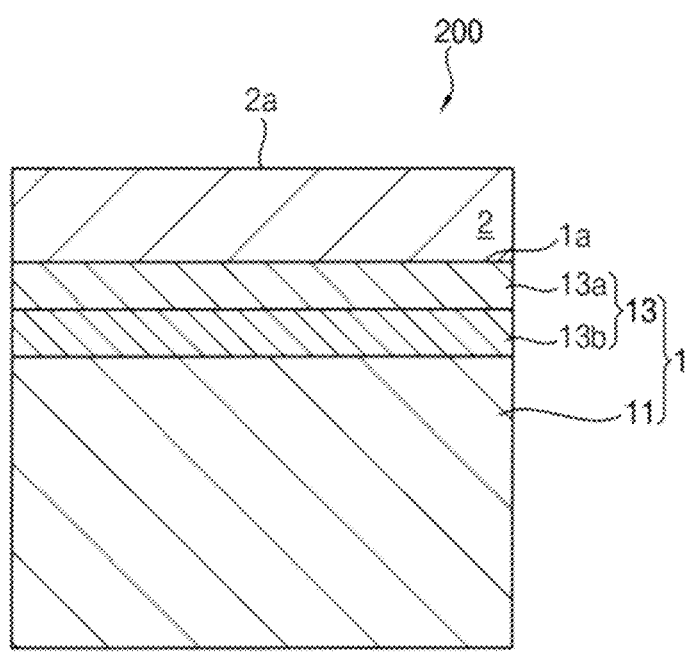
FIG. 2 is a cross-sectional view of a surface layer in accordance with Embodiment 1.

As shown in FIG. 2, in an embodiment, a member 200 includes an interface layer 13 of a base material structure 1 that includes fluorine. The interface layer 13 of the base material structure 1 includes a first layer 13a and a second layer 13b. The base material body 11 contacts the interface layer 13 of the base material structure 1. The second layer 13b is closer to the base material body 11 than the first layer 13a. The second layer 13b is disposed in contact with the base material body 11, and is disposed between the base material body 11 and the first layer 13a. The second layer 13b has a flourine content that is greater than that of the first layer 13a. The interface layer 13 of the base material structure 1 does not include yttrium (Y).

Hereinafter, particular structures of the member 200 will be described.

An X-ray diffraction peak intensity ratio of the (1 5 1) plane with respect to the (1 0 0) plane of the surface layer 2 is greater than an X-ray diffraction peak intensity ratio of the (1 5 1) plane with respect to (1 0 0) plane of a raw material powder of the surface layer 2. A particle that includes Y—O—F has an average diameter of greater than about 10 nm and less than about 100 nm, and the surface layer 2 has a porosity of less than about 2%. The average diameter of a particle that includes Y—O—F can be specified by SEM observation or TEM observation. A lower limit of the porosity of the surface layer 2 is 0%. Y—O—F has a rhombohedral crystal structure, and includes one of $Y_5O_4F_7$, $Y_1O_{0.826}F_{1.348}$, $Y_6O_5F_8$, $Y_7O_6F_9$, or $Y_{17}O_{14}F_{23}$. The base material structure 1 may include one of ceramic, metal, glass or an organic compound. The ceramic may include, e.g., alumina ($\alpha$-$Al_2O_3$). The metal may include, e.g., stainless steel.

According to the structure of the member 200, in an embodiment, the second layer 13b is placed closer to the base material body 11 than the first layer 13a, and has a fluorine content that is greater than that of the first layer 13a. Thus, atoms can mix at an area near an interface between the surface layer 2 and the base material structure 1. Accordingly, the bonding intensity between the surface layer 2 and the base material structure 1 increases. That is, the surface layer 2 that has good plasma tolerance can be stably formed onto the base material structure 1.

Hereinafter, a method of manufacturing a member in accordance with exemplary embodiments will be described with reference to FIG. 3.

In an embodiment, a posture and position of a nozzle or the base material structure 1 is fixed (step ST1). In particular, a posture and position of at least one of the nozzle or the base material structure 1 is fixed so that a particle incident angle formed by a spray axis of a raw material powder from the nozzle and a plane of the base material structure 1 is equal to or less than about 30 degrees. The base material structure 1 includes a plane 1a, and may be, e.g., a substrate.

In an embodiment, the raw material powder and nitrogen gas are mixed in an enclosed space, such as a layer formation chamber, and an aerosol is generated (step ST2). For example, the raw material powder includes a plurality of raw material particles. The raw material particles may be, e.g., Y—O—F. Y—O—F has a rhombohedral crystal structure, and includes one of $Y_5O_4F_7$, $Y_1O_{0.826}F_{1.348}$, $Y_6O_5F_8$, $Y_7O_6F_9$, or $Y_{17}O_{14}F_{23}$.

In an embodiment, the aerosolized raw material powder is sprayed through the nozzle onto the plane 1a of the base material structure 1, and the surface layer 2 is formed on the plane of the base material structure 1 (step ST3).

In an embodiment, the particle incident angle formed by the spray axis of spray of the aerosolized raw material powder and the plane of the base material structure 1 is equal to or less than about 30 degrees. The particle incident angle is in a range from about 5 degrees to about 30 degrees. A lower limit of the particle incident angle is one of 5 degrees, 15 degrees, 20 degrees or 25 degrees. An upper limit of the particle incident angle is one of 15 degrees, 20 degrees, 25 degrees or 30 degrees. If the particle incident angle has a range equal to or greater than about 5 degrees, the particle might not collide with and cut the base material structure 1. In addition, if the particle incident angle has a range equal to or greater than about 5 degrees, many manufacturing apparatuses can be used. If the particle incident angle has a range equal to or less than about 30 degrees, a dense layer can be formed. In addition, if the particle incident angle has a range equal to or less than about 20 degrees, a dense layer can be stably formed on a substrate that includes various materials, such as alumina ($\alpha$-$Al_2O_3$), stainless steel, etc.

In an embodiment, a spray velocity of the aerosolized raw material powder is greater than about 0 m/sec and less than about 60 m/sec. A lower limit of the spray velocity is one 0 m/sec, 15 m/sec, 18.5 m/sec, 45 m/sec or 55.6 m/sec. An upper limit of the spray velocity is one of 18.5 m/sec, 45 m/sec, 55.6 m/sec or 60 m/sec.

By the above processes, in an embodiment, the surface layer 2 is formed on the plane of the base material structure 1. Thus, the members 100 and 200 of FIGS. 1 and 2 can be manufactured.

Hereinafter, a manufacturing apparatus 300 will be described with reference to FIG. 4. A member in accordance with exemplary embodiments can be manufactured using the manufacturing apparatus 300.

Figure 4:
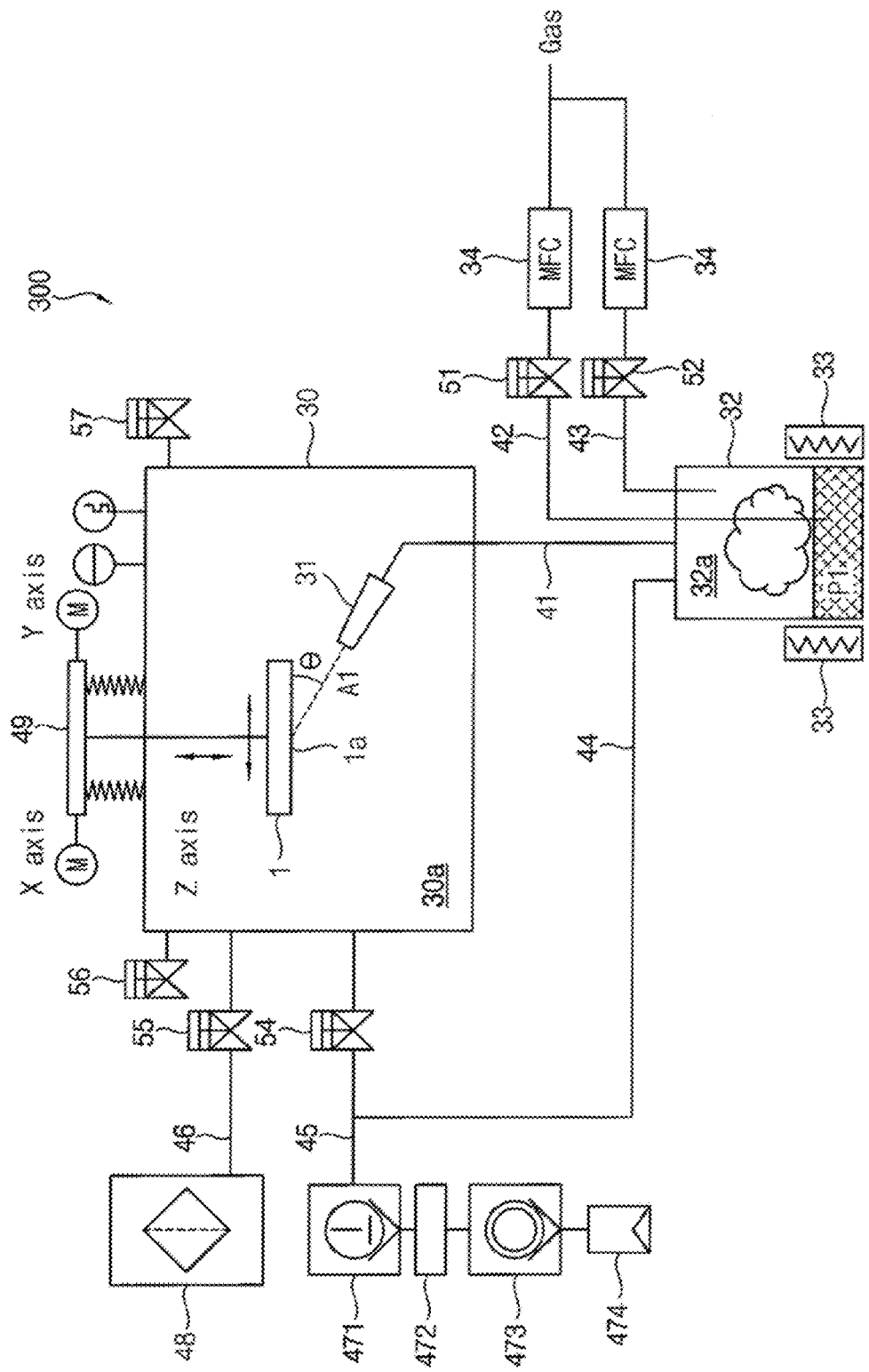
FIG. 4 illustrates a manufacturing apparatus for a surface layer in accordance with exemplary embodiments.

As shown in FIG. 4, in an embodiment, the manufacturing apparatus 300 includes a layer formation chamber 30 and an aerosol generator 32.

In an embodiment, the aerosol generator 32 includes an aerosol generation space 32a therein. The aerosol generator 32 holds a raw material powder P1 in the aerosol generation space 32a. The aerosol generator 32 includes a heater 33 that heats the aerosol generation space 32a, and also heats the raw material powder P1, gas, etc.

In an embodiment, the aerosol generator 32 is connected with a gas source through gas pipes 42 and 43. An aerosol medium gas is provided from the gas source through the gas pipes 42 and 43 to the aerosol generation space 32a. A mass flow controller (MFC) 34 and a valve 51 are sequentially disposed in the gas pipe 42. The gas pipe 42 extends to a bottom of the aerosol generation space 32a, and provides gas directly to the raw material powder P1. The MFC 34 and a valve 52 are sequentially disposed in the gas pipe 43. The gas pipe 43 extends to an upper portion of the aerosol generation space 32a.

In an embodiment, the aerosol generator 32 is connected with an exhaust pipe 45 through a gas pipe 44. A valve 54, a mechanical booster pump (MBP) 471, a particle mist trap 472, a rotary pump (RP) 473 and an oil mist trap 474 are sequentially disposed in the exhaust pipe 45. The gas pipe 44 is connected with the exhaust pipe 45 between the valve 54 and the MBP 471.

In an embodiment, the layer formation chamber 30 includes a nozzle 31, a base material structure holding part 49, and valves 56 and 57.

In an embodiment, the layer formation chamber 30 includes a layer formation space 30a therein. The nozzle 31 is disposed in the layer formation space 30a. The nozzle 31 is contained by the layer formation chamber 30 so that it can change its position and posture. The nozzle 31 and the aerosol generator 32 are connected with each other through a pipe 41. The nozzle 31 receives the aerosolized raw material powder P1 from the aerosol generator 32. The nozzle 31 sprays the aerosolized raw material P1 into the layer formation space 30a. The aerosolized raw material powder P1 is sprayed along a spray axis A1.

In an embodiment, the base material structure holding part 49 can move in XYZ axis directions in a 3-dimensional orthogonal coordinate system using a motor M while holding the base material structure 1. The base material structure 1 has the plane 1a. A particle incident angle θ formed by the spray axis A1 of the aerosolized raw material powder P1 and the plane 1a is equal to or less than about 30 degrees.

In an embodiment, by opening or closing the valves 56 and 57, gas may be provided into or exhausted from the layer formation space 30a.

In an embodiment, the layer formation chamber 30 may be connected with the exhaust pipe 45 and a pipe 46.

In an embodiment, when the valve 54 is open, gas in the layer formation space 30a can be exhausted or an inner pressure can be reduced, using the MBP 471 and the RP 473. Mist can be removed using the particle mist trap 472 and the oil mist trap 474.

In an embodiment, a valve 55 and a dust collector 48 are sequentially disposed in the pipe 46 downstream from the layer formation chamber 30. When the valve 55 is open, dust or debris can be removed using the dust collector 48.

Hereinafter, an example of an embodiment will be described using FIGS. 5 to 23D.

The example of an embodiment is the member 200 that was formed by performing a method of manufacturing the member using the manufacturing apparatus 300. Hereinafter, details of an experiment on the example will be described.

Raw Material Powder of $Y_5O_4F_7$

Figure 5:
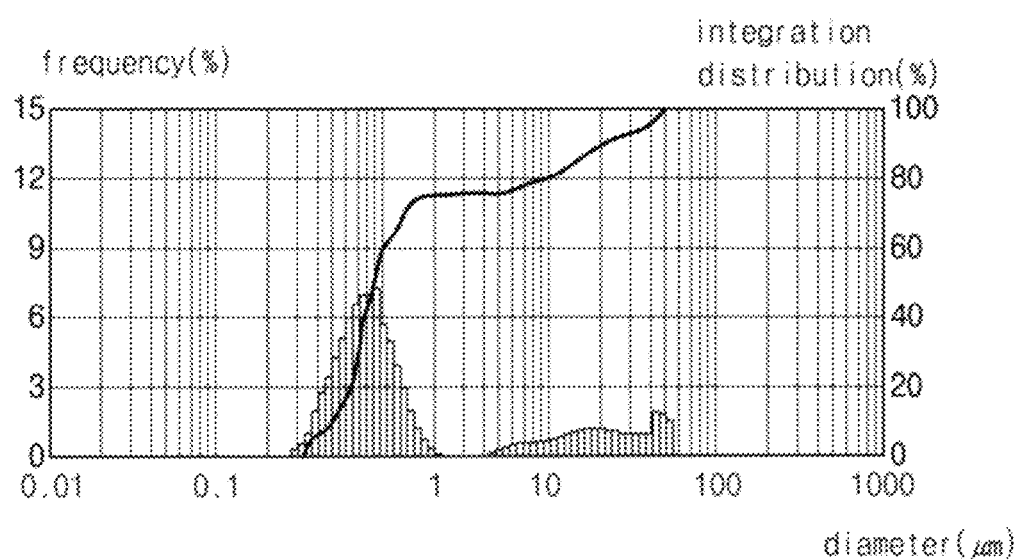
FIG. 5 is a graph that illustrates a frequency and an integration distribution curve as a function of diameter.

In an embodiment, a plurality of particles that include $Y_5O_4F_7$ was used as a raw material powder. The plurality of $Y_5O_4F_7$ particles was detected using a laser diffraction diameter detection device. A diameter distribution of the plurality of $Y_5O_4F_7$ particles is shown in FIG. 5. As shown in FIG. 5, an average diameter $D_{50}$ of the plurality of $Y_5O_4F_7$ particles is about 0.9 μm (900 nm). In addition, an average diameter $D_{50}$ of the plurality of $Y_5O_4F_7$ particles used in Examples 6 to 8 that will be illustrated below is about 0.8 μm (800 nm). The average diameter $D_{50}$ means a diameter at an integration value of 50% in a diameter distribution. The diameter measurements can be obtained by a laser diffraction and scattering method.

Figure 6:
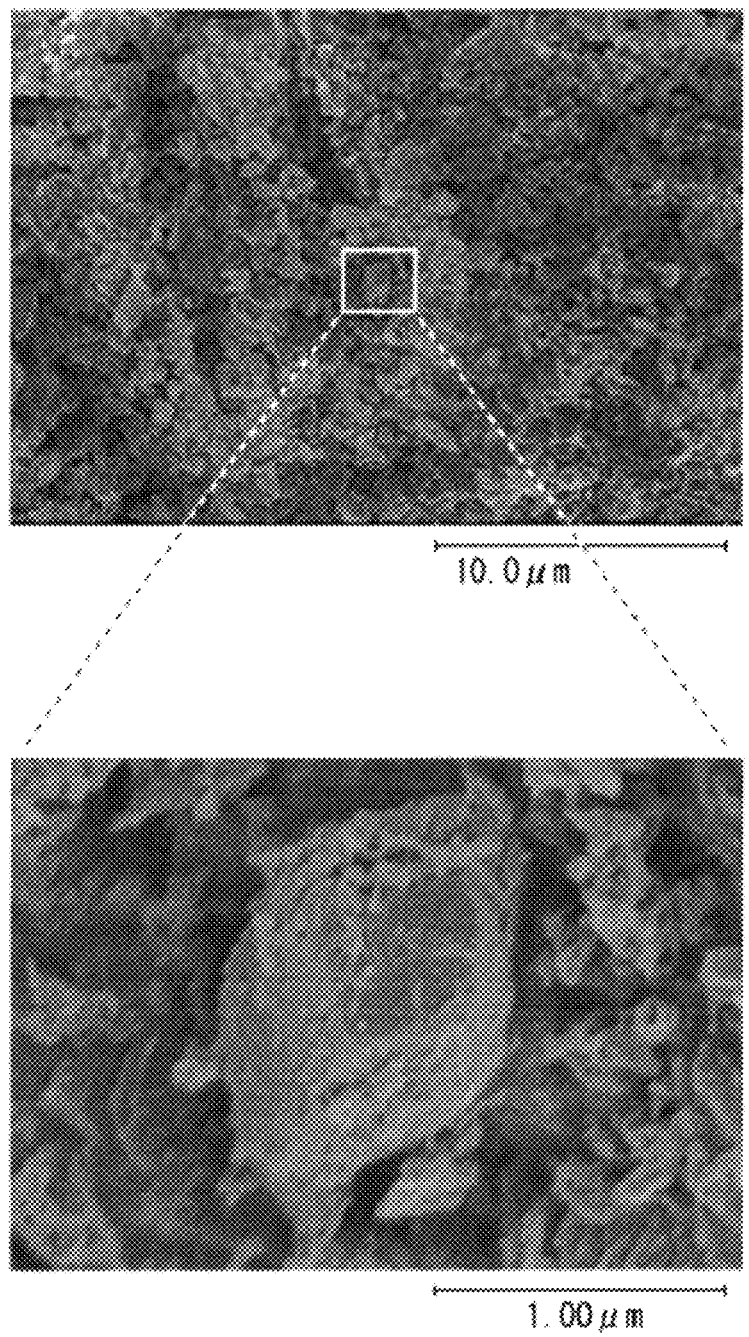
FIG. 6 is a photo and an enlarged photo of a main portion that illustrates a micro structure of a raw material powder that includes $Y_5O_4F_7$.

Micro structures of the plurality of $Y_5O_4F_7$ particles were observed using a scanning electron microscope (SEM). The observed photos and enlarged photos the micro structures are shown in FIG. 6, As shown in FIG. 6, the raw material powder includes a plurality of particles having a diameter of, e.g., about 0.9 μm, which corresponds to the average diameter $D_{50}$ of about 0.9 μm.

Figure 7:
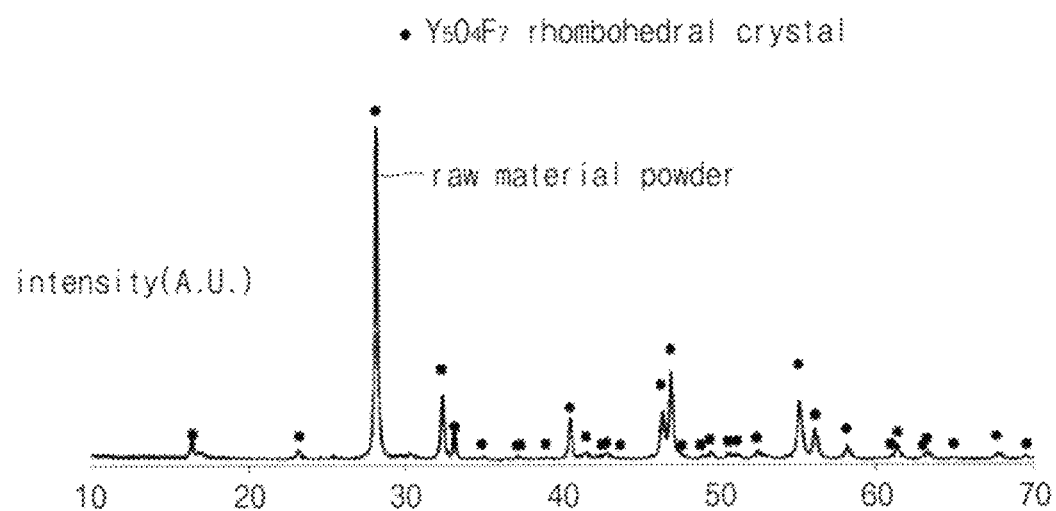
FIG. 7 is a graph that illustrates an X-ray diffraction pattern of a raw material powder that includes $Y_5O_4F_7$.
Figure 8:
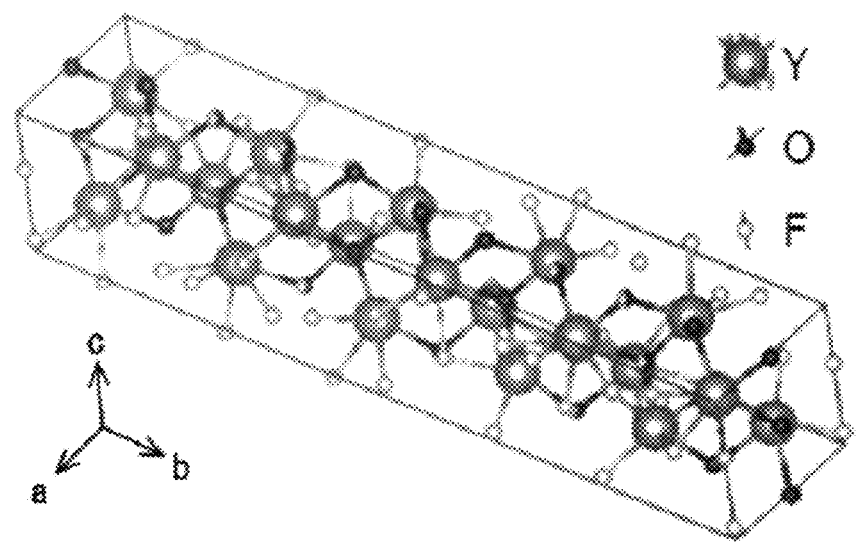
FIG. 8 is a perspective view that illustrates a rhombohedral crystal structure of $Y_5O_4F_7$.

Crystal structures of the plurality of $Y_5O_4F_7$ particles were observed by an X-ray diffraction method using Cu-Ka radiation, and the results are shown in FIG. 7. As shown in FIG. 7, a peak position and a peak intensity ratio of the raw material powder approximately coincide with data (01-080-1124) of rhombohedral $Y_5O_4F_7$ of the international center for diffraction data (ICDD), which is indicated by "*," and the crystal structures include a single phase. FIG. 8 shows a crystal structure of rhombohedral $Y_5O_4F_7$. FIG. 8 was drawn using a 3-D abc orthogonal coordinates system.

Substrate: Stainless Steel

Hereinafter, an experiment for preliminarily estimating the particle incident angle θ will be described.

In an embodiment, a plate that includes stainless steel was used as a substrate. When a plate that includes stainless steel is used as the substrate, a state of a layer, in particular, a shape of the layer, can be easily observed by naked eyes.

In an embodiment, the surface layer was formed on the substrate, and the member was manufactured by a method of manufacturing a member substantially the same as an above-described method, except for the particle incident angle θ. The process conditions are as follows.

Size of the substrate: 20 mm×80 mm; particle incident angle θ: 0~90 degrees; distance between the nozzle and the substrate: 10 nm: gas used: nitrogen; substrate temperature: room temperature; gas flow: 24 L/min; maximum particle velocity: 44.4 m/sec; pressure in the layer formation chamber; 100 Pa pressure in the aerosol chamber: 50 kPa; layer formation time: 1 min. Test pieces were divided by the particle incident angle θ into Examples 1 to 3, and Comparative Examples 1 and 2. The maximum particle velocity is a gas velocity. That is, the maximum particle velocity is the gas flow divided by an area of the nozzle opening.

The state of the surface layer was observed by naked eyes, and Examples 1 to 3 and Comparative Examples 1 and 2 were classified into one of a dense film, a compact powder, and a mixture of a dense film and a compact powder. The state of the layer according to the particle incident angle θ is shown in table 1. In addition, the photos of the members according to Examples 1 to 3 and Comparative Examples 1 and 2 are shown in FIG. 9.

TABLE 1

| No. | Particle incident angle θ (degrees) | State of the surface layer |
|---|---|---|
| Example 1 | 5 | Dense film |
| Example 2 | 15 | Dense film |
| Example 3 | 30 | Mixture of dense film and compact powder |
| Comparative Example 1 | 60 | Compact powder |
| Comparative Example 2 | 90 | Compact powder |

Figure 9:
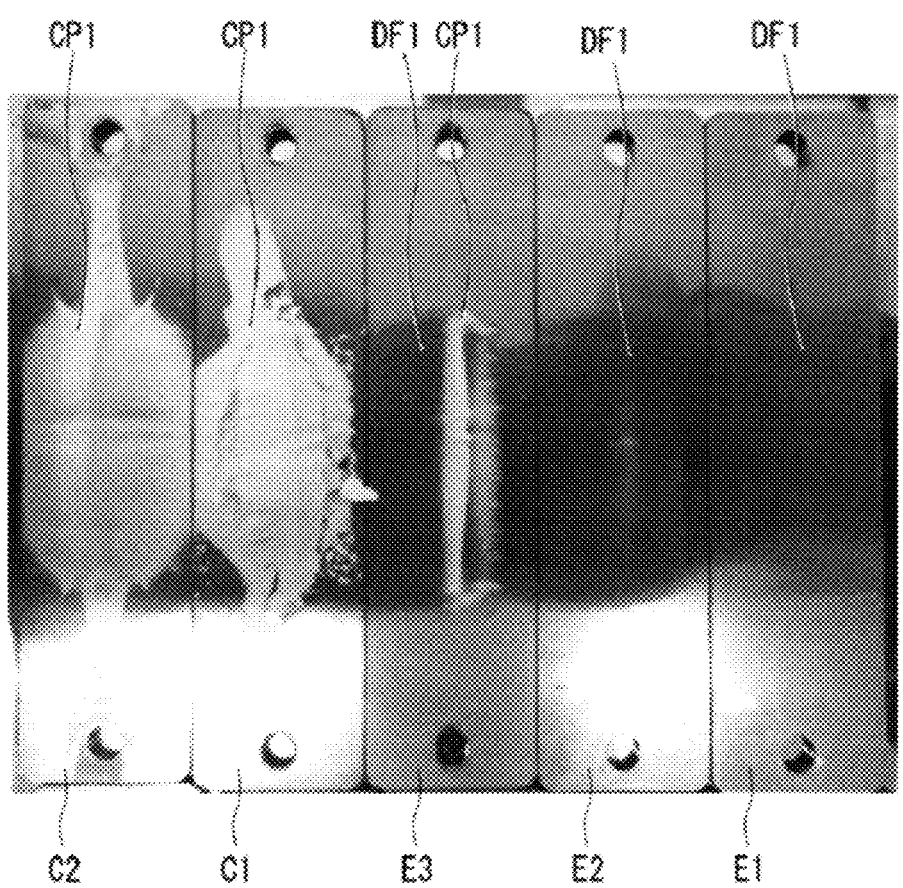
FIG. 9 is a photo that illustrates Examples 1 to 3 and Comparative Examples 1 to 2.

As shown in FIG. 9, a compact powder CP1 is not formed on members E1 and E2 of Examples 1 and 2, respectively, while a dense film DF1 is formed thereon. The dense film DF1 and the compact powder CP1 are formed on a member E3 of Example 3. The dense film DF1 is not formed on substrates C1 and C2 of Comparative Examples 1 and 2, respectively, while the compact powder CP1 is formed thereon. When the particle incident angle θ is equal to or less than about 30 degrees, the formation of the dense film DF was confirmed. When the particle incident angle θ is equal to or greater than about 5 degrees, the formation of the dense film DF1 was confirmed. Thus, the particle incident angle θ is in a range from about 5 degrees to about 30 degrees.

Substrate: $\alpha$-$Al_2O_3$

An experiment was performed to estimate detailed manufacturing conditions when the particle incident angle θ is equal to or less than about 30 degrees. The results of the experiment that was performed to preliminarily estimating the particle incident angle θ confirm that a dense film was formed when the particle incident angle θ is equal to or less than about 30 degrees.

As a member, a substrate that includes $\alpha$-$Al_2O_3$ was used. $\alpha$-$Al_2O_3$ is used as a part of a chamber in a plasma process.

A surface layer was formed on the member by using a method of manufacturing a member in accordance with exemplary embodiments. The process conditions are as follows.

Size of the substrate: 30 mm×30 mm; distance between the nozzle and the substrate: 40 mm; pressure in the aerosol chamber: 50 kPa; and other conditions are shown in table 2 as follows.

TABLE 2

| | Manufacturing conditions | | | | | | | results |
|---|---|---|---|---|---|---|---|---|
| No. | Average diameter of raw material powder $D_{50}$ (um) | Substrate material | Particle incident angle θ (degree) | Kind of gas | flow (L/min) | Maximum particle velocity (m/s) | Layer formation chamber pressure (Pa) | Layer formation time (min) | State of surface layer |
| Example 4 | 0.9 | $\alpha$-$Al_2O_3$ | 15 | $N_2$ | 24 | 44.4 | 100 | 30 | Dense film |
| Example 5 | 0.9 | $\alpha$-$Al_2O_3$ | 20 | $N_2$ | 24 | 44.4 | 100 | 30 | Dense film |
| Reference example | 0.9 | $\alpha$-$Al_2O_3$ | 30 | $N_2$ | 24 | 44.4 | 100 | 30 | Mixture of dense film and compact powder |
| Example 6 | 0.8 | $SiO_2$ | 15 | $N_2$ | 24 | 44.4 | 100 | 40 | Dense film |
| Example 7 | 0.8 | $SiO_2$ | 20 | $N_2$ | 24 | 44.4 | 100 | 40 | Dense film |
| Example 8 | 0.8 | $SiO_2$ | 25 | $N_2$ | 24 | 44.4 | 100 | 40 | Dense film |
| Example 9 | 0.9 | $\alpha$-$Al_2O_3$ | 20 | $N_2$ | 24 | 44.4 | 80 | 60 | Dense film |
| Example 10 | 0.9 | $\alpha$-$Al_2O_3$ | 20 | $N_2$ | 24 | 44.4 | 110 | 30 | Dense film |
| Example 11 | 0.9 | $\alpha$-$Al_2O_3$ | 20 | $N_2$ | 24 | 44.4 | 245 | 60 | Dense film |
| Example 12 | 0.9 | $\alpha$-$Al_2O_3$ | 20 | $N_2$ | 10 | 18.5 | 120 | 60 | Dense film |
| Example 13 | 0.9 | $\alpha$-$Al_2O_3$ | 20 | $N_2$ | 30 | 55.6 | 120 | 60 | Dense film |

The states of the surface layers of Examples 4 to 13 and Reference Example were observed by naked eyes, and cross-sections of areas near surfaces of the surface layers were observed using SEM or TEM. X-ray diffraction patterns of the raw material powder, Examples 4 to 13 and Reference Example were detected, and adhesion forces were detected. The results are shown in table 3. The raw material powder includes a plurality of $Y_5O_4F_7$ particles such as those used in a manufacturing method in accordance with Examples 1 to 13 and Reference Example.

adhesion force between the surface layer SF3 and the substrate SS3 in Reference Example is less than an adhesion force between the surface layer SF2 and the substrate SS2 in Example 5. The adhesion force of Reference Example is determined as a failure.

Figure 11:
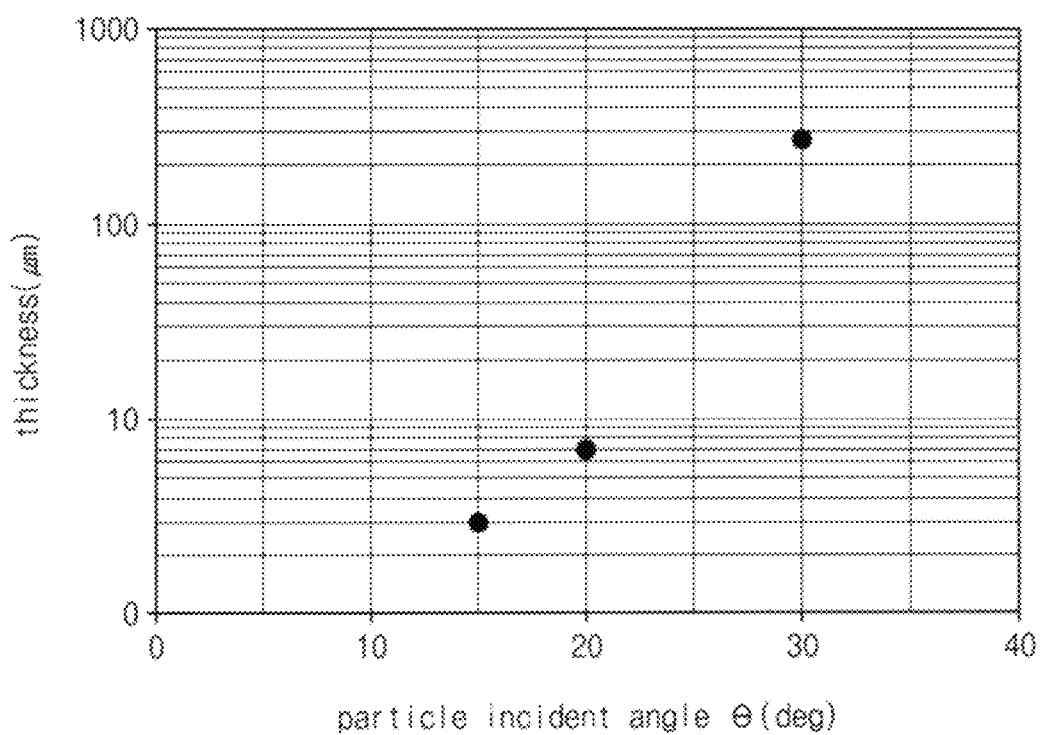
FIG. 11 is a graph that illustrates a thickness of a surface layer as a function of a particle incident angle θ in Examples 4 and 5 and Reference Example.

A thickness of a surface layer as a function of particle incident angle θ in Reference Example and Examples 4 and 5 are shown in FIG. 11. As shown in FIG. 11, as the particle incident angle θ increases, the thickness of the surface layer tends to increase. The surface layer was a dense film when

TABLE 3

| No. | Results Layer thickness (um) | XRD results (peak intensity and peak intensity ratio) | | | | | Adhesion force (MPa) |
|---|---|---|---|---|---|---|---|
| | | I(151) (cps · deg) | I(100) (cps · deg) | I(0100) | I(100)/ I(151) | I(0100)/ I(151) | |
| Raw material powder | — | 238977.60 | 10720.11 | 49112.50 | 0.045 | 0.206 | — |
| Example 4 | 3.1 | 87865.63 | 11356.52 | 12347.10 | 0.129 | 0.141 | 40.8 |
| Example 5 | 6.9 | 147418.65 | 15987.44 | 13890.98 | 0.108 | 0.094 | 54.2 |
| Reference Example | 257.9 | 225802.95 | 20551.29 | 33308.60 | 0.091 | 0.148 | failure |
| Example 6 | 1.5 | 41650.89 | 16545.48 | 6235.12 | 0.397 | 0.150 | — |
| Example 7 | 5.5 | 85758.93 | 25753.89 | 11374.86 | 0.300 | 0.133 | — |
| Example 8 | 16.0 | 155040.40 | 29877.58 | 19773.64 | 0.193 | 0.128 | — |
| Example 9 | 9.0 | 144513.97 | 12855.70 | 16497.44 | 0.089 | 0.114 | — |
| Example 10 | 5.0 | 147418.65 | 15987.44 | 13890.98 | 0.108 | 0.094 | — |
| Example 11 | 6.1 | 137812.25 | 70192.28 | 13409.06 | 0.509 | 0.097 | — |

Cross-sections of areas near surfaces of the substrates in accordance with Examples 4 and 5 and Reference Example were observed using SEM. SEM photos showing the cross-sections and enlarged photos are shown in FIGS. 10A to 10C.

Figure 10A:
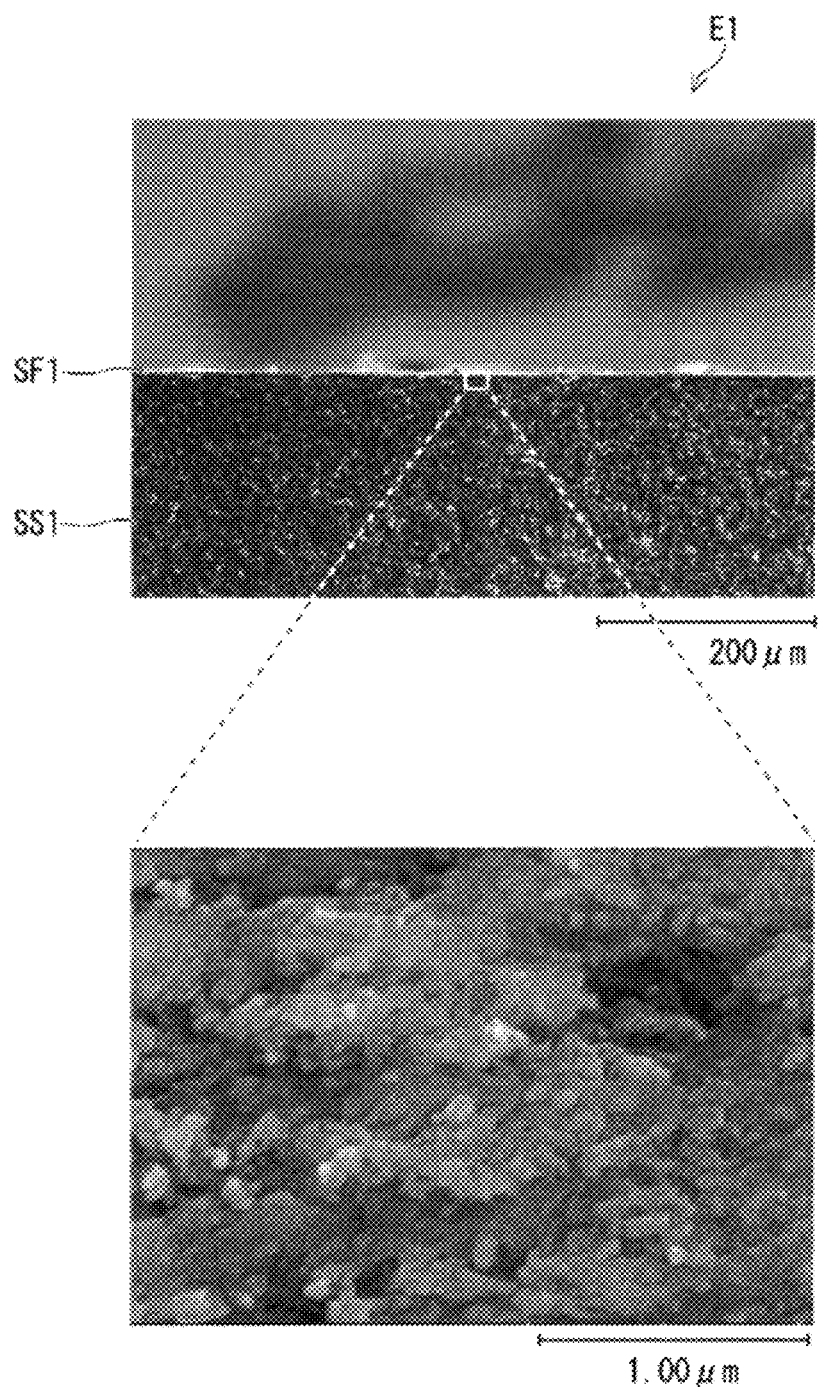
FIG. 10A is a SEM photo and an enlarged photo that illustrate a cross-section near a surface of a member in Example 4.
Figure 10B:
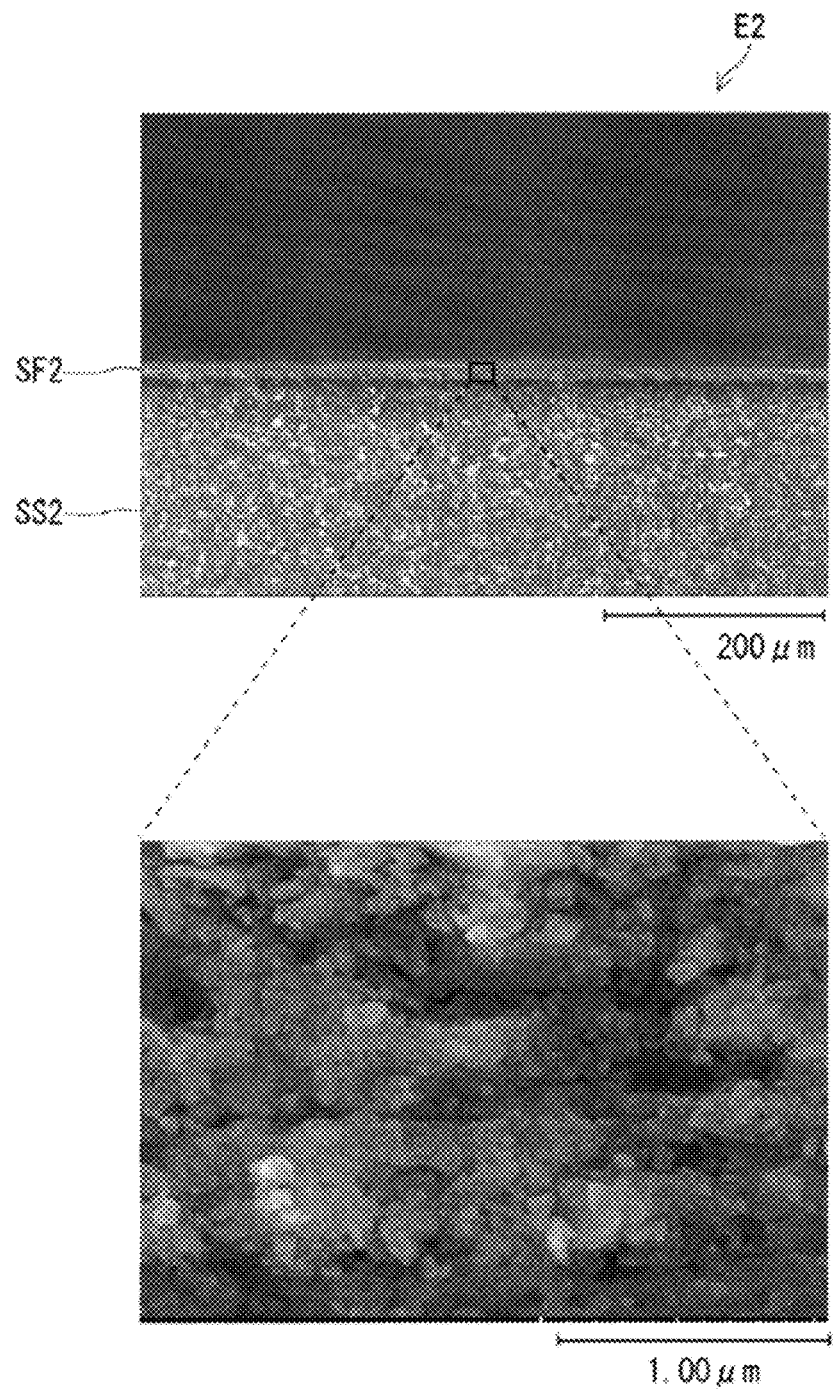
FIG. 10B is a SEM photo and an enlarged photo that illustrate a cross-section near a surface of a member in Example 5.

As shown in FIG. 10A, a surface layer SF1 was formed on a substrate SS1 in the member E1 of Example 4. The surface layer SF1 includes a particle that has a diameter of about 10 nm (0.01 um). Likewise, as shown in FIG. 10B, a surface layer SF2 in the member E2 of Example 5 includes a particle that has a diameter of about 10 nm. The particle that has the diameter of about 10 nm (0.01 um) is smaller than the particle that has an average diameter $D_{50}$ of about 0.9 um in the raw material powder.

Figure 10C:
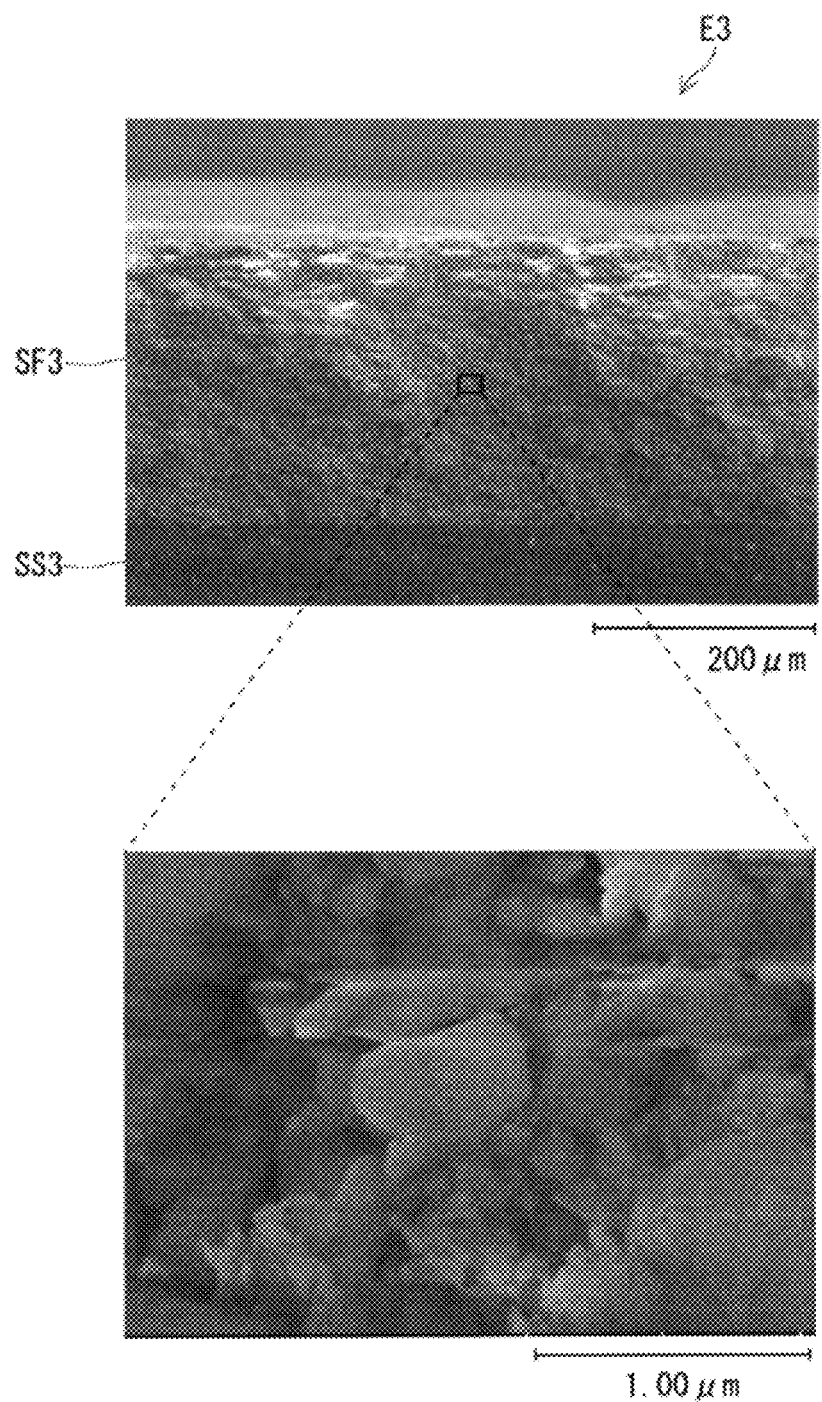
FIG. 10C is a SEM photo and an enlarged photo that illustrate a cross-section near a surface of a member in Reference Example.

As shown in FIG. 10C, most particles in a surface layer SF3 in the member E3 of Reference Example have a diameter of, e.g., about 500 nm to about 1000 nm (0.5 um~1.0 um), hereinafter referred to as the larger particles, and fewer particles that have a diameter of about 10 nm (0.01 um), hereinafter referred to as the smaller particles. The larger particles are substantially the same size as the 0.9 um average diameter $D_{50}$ particles in the raw material powder. Thus, most of the surface layer SF3 includes compact powders that can be formed by being compressed and deposited from the raw material powder. When a tape test was performed on the member E3, the surface layer SF3 was easily exfoliated from the substrate SS3. An adhesion force between the surface layer SF3 and the substrate SS3 in Reference Example is less than an adhesion force between the surface layer SF1 and the substrate SS1 in Example 4. An the particle incident angle θ is below about 20 degrees. The surface layer was almost a compact powder when the particle incident angle θ was about 30 degrees. Thus, when the particle incident angle θ is equal to or less than about 20 degrees, the surface layer tends to be a dense film.

Figure 12:
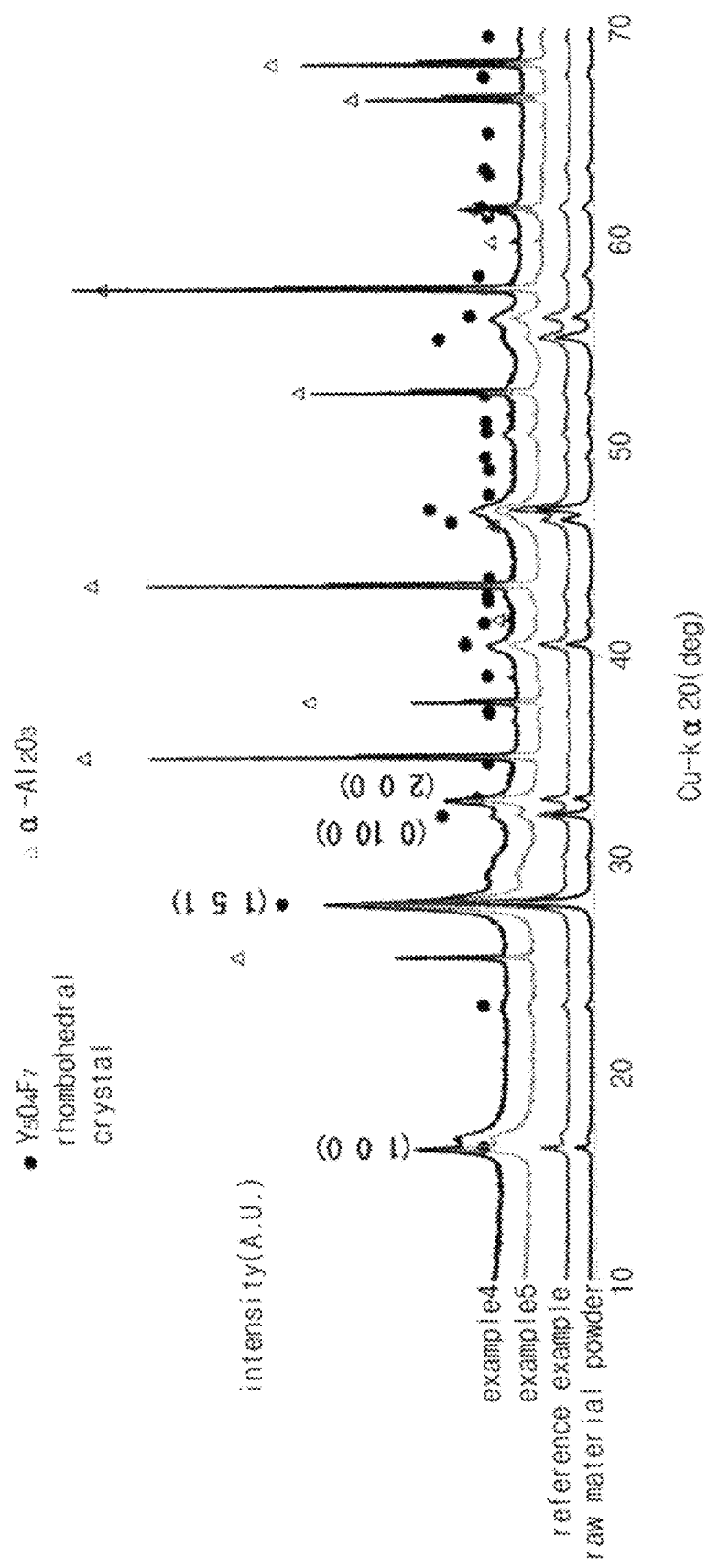
FIG. 12 is a graph that illustrates an X-ray diffraction pattern of a raw material powder, Examples 4 and 5, and Reference Example.

X-ray diffraction patterns of the surface layers in the raw material powder, Reference Example, and Examples 4 and 5 are shown in FIG. 12. A shown in FIG. 12, a peak position of the surface layer denoted by "*" approximately coincides with data of the rhombohedral $Y_5O_4F_7$ of ICDD (01-080-1124), and as with the raw material powder in FIG. 7, the surface layers of Reference Example and Examples 4 and 5 include a single phase rhombohedra $Y_5O_4F_7$.

Figure 13:
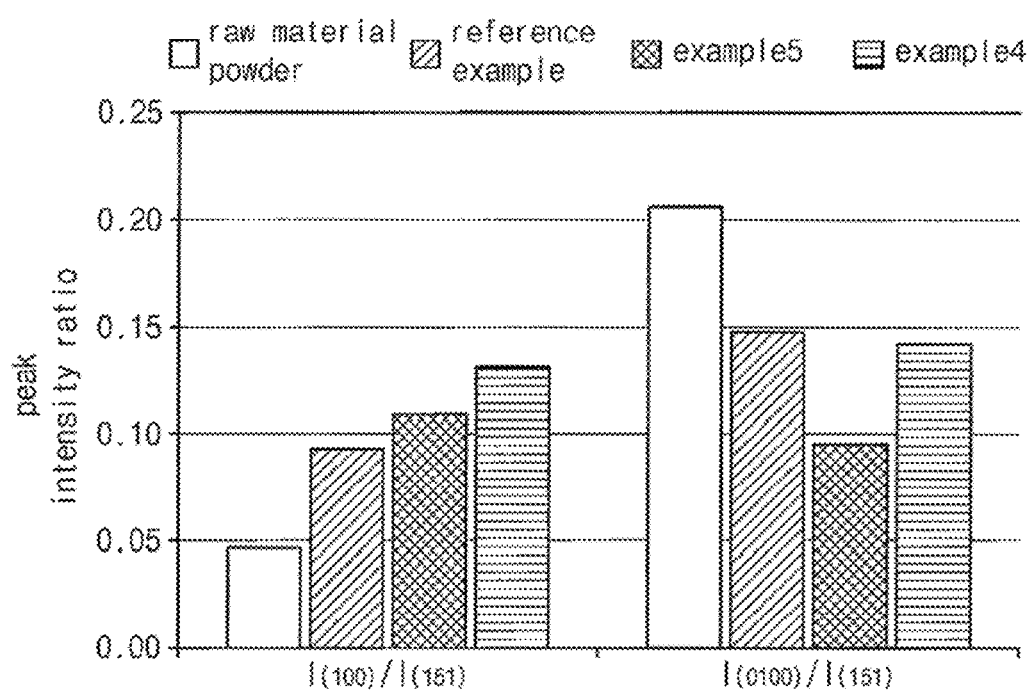
FIG. 13 is a bar graph that illustrates an X-ray diffraction peak intensity ratio of a raw material powder, Reference Example, and Examples 4 and 5.

X-ray diffraction peak intensity ratios of the raw material powder, Reference Example, and Examples 4 and 5 are shown in FIG. 13. In particular, FIG. 13 shows a ratio of an X-ray diffraction peak intensity of a (1 5 1) plane with respect to an X-ray diffraction peak intensity of a (1 0 0) plane, and a ratio of an X-ray diffraction peak intensity of a (1 5 1) plane with respect to an X-ray diffraction peak intensity of a (0 10 0) plane, in the raw material powder, Reference Example, and Examples 4 and 5.

As shown in FIG. 13, the ratios of the X-ray diffraction peak intensity of the (1 5 1) plane of the surface layer with respect to the X-ray diffraction peak intensity of the (1 0 0) plane of the surface layer in Reference Example and Examples 4 and 5 are higher than the ratio of the X-ray diffraction peak intensity of the (1 5 1) plane with respect to the X-ray diffraction peak intensity of the (1 0 0) plane in the raw material powder. The ratios of the X-ray diffraction peak intensity of the (1 5 1) plane of the surface layer with respect to the X-ray diffraction peak intensity of the (1 0 0) plane of the surface layer in Reference Example and Examples 4 and 5 increase as the particle incident angle θ increases. It is believed that the crystalline orientation changes according to the particle incident angle θ.

The ratios of the X-ray diffraction peak intensity of the (1 5 1) plane of the surface layer with respect to the X-ray diffraction peak intensity of the (0 10 0) plane of the surface layer in Reference Example and Examples 4 and 5 are lower than the ratio of the X-ray diffraction peak intensity of the (1 5 1) plane with respect to the X-ray diffraction peak intensity of the (0 10 0) plane in the raw material powder. The X-ray diffraction pattern of the raw material powder approximately coincides with data of the ICDD of the raw material powder, and thus it may be considered that the ratios of the X-ray diffraction peak intensity of the (1 5 1) plane of the surface layer with respect to the X-ray diffraction peak intensity of the (0 10 0) plane of the surface layer in Reference Example and Examples 4 and 5 are lower than the ratio of the X-ray diffraction peak intensity of the (1 5 1) plane with respect to the X-ray diffraction peak intensity of the (0 10 0) plane in the ICDD date of the raw material powder.

Observation results about Example 5 using transmission electron microscope (TEM) and energy dispersive X-ray spectroscopy (EDX) will be now described.

Figure 14A:
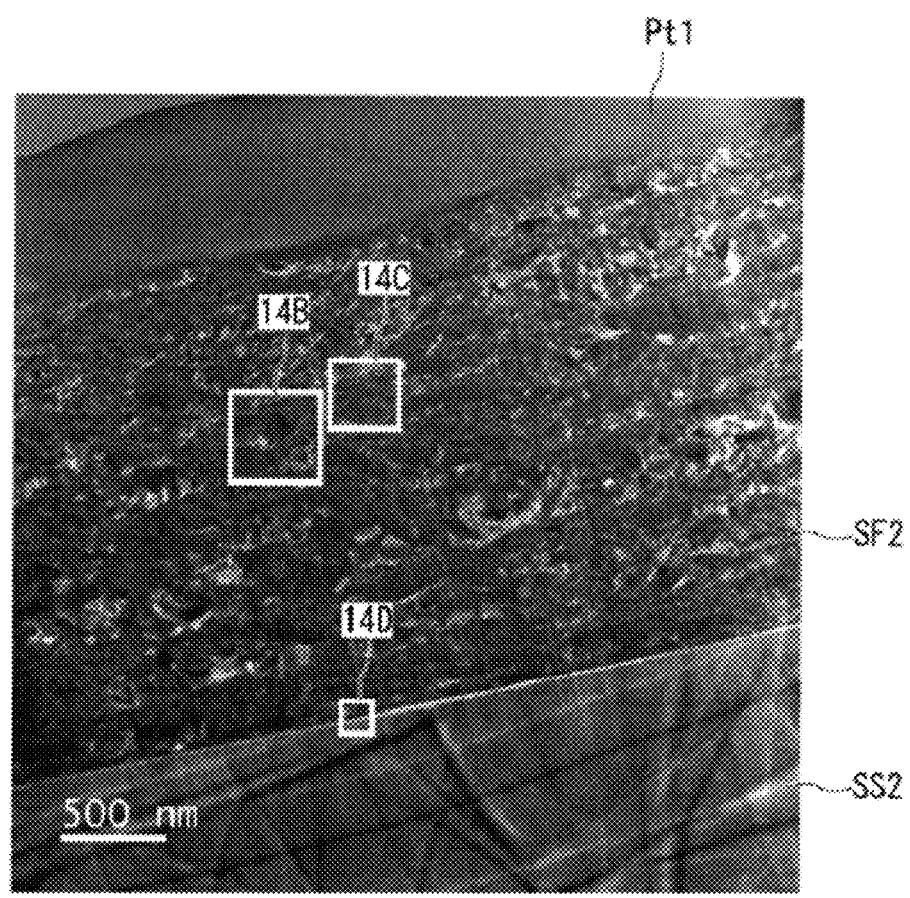
FIG. 14A is a TEM photo of a cross-section of a member in Example 5.

FIG. 14A shows a TEM photo of a cross-section of a member in Example 5. As shown in FIG. 14A, the surface layer SF2 and the substrate SS2 are confirmed in the member E2 of Example 5. A platinum protection layer Pt1 is formed on the surface layer SF2.

Figure 14B:
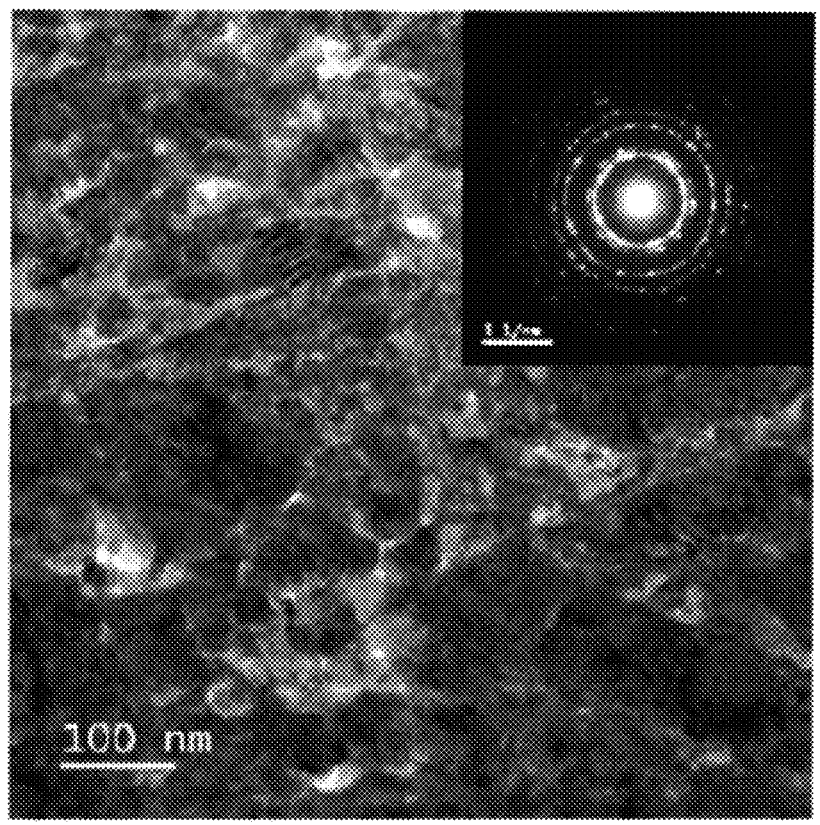
FIG. 14B is an enlarged TEM photo of a main portion and an electron diffraction pattern of a member in Example 5.

FIG. 14B shows an enlarged portion of the TEM of FIG. 14A and an electron diffraction pattern of the member in Example 5. As shown in FIG. 14B, the member of Example 5 has a poly-crystalline structure. No void was seen in the member of Example 5, and thus the porosity of the member is determined to be equal to or less than about 10% and equal to or greater than about 0%.

Figure 14C:
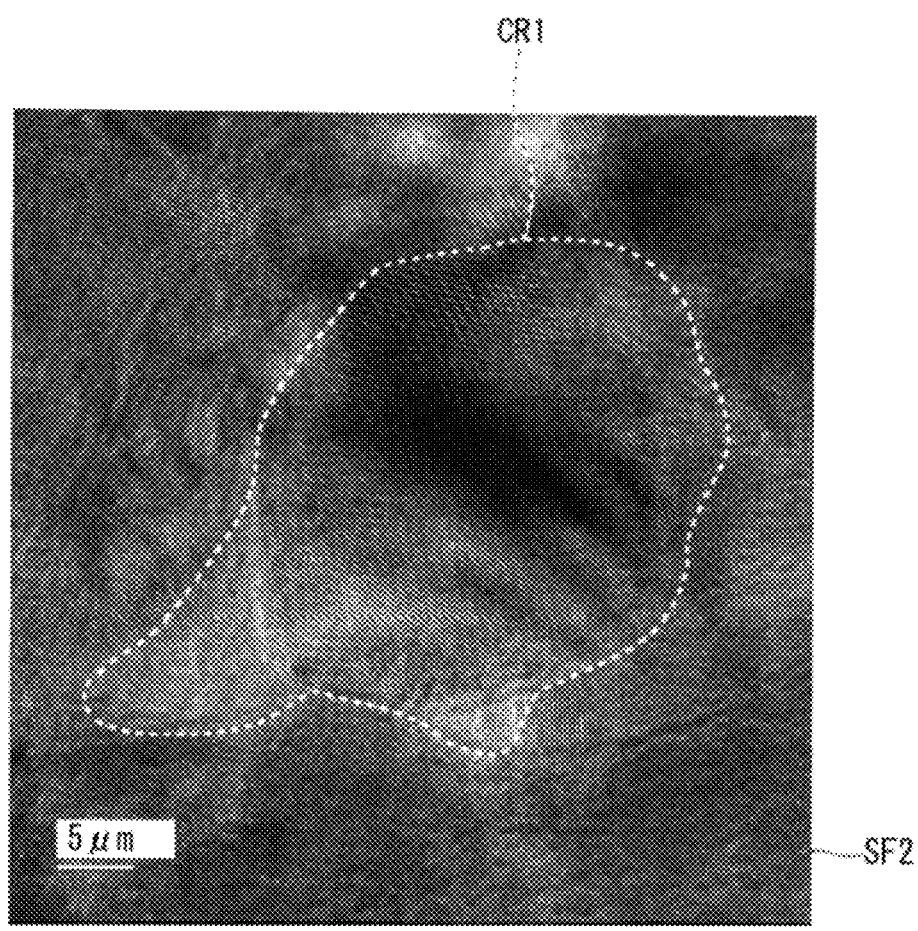
FIG. 14C is an enlarged TEM photo of a member in Example 5.
Figure 14D:
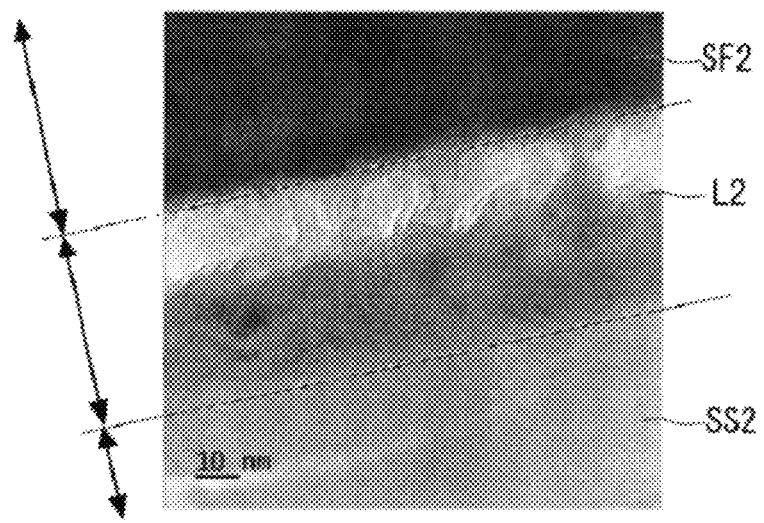
FIG. 14D is an enlarged TEM photo of a member in Example 5.

FIGS. 14C and 14D show enlarged portions of the TEM of FIG. 14A of the member in Example 5. As shown in FIG. 14C, a plurality of crystals CR1 that have a size of 10 nm, e.g., about 10 nm to about 100 nm, is arranged on the surface layer SF2. As shown in FIG. 14D, an interface layer L2 at the substrate side is disposed between the surface layer SF2 and the substrate SS2.

Atom mappings of an interface area in Example 5 by EDX are shown in FIGS. 15A to 15D. FIGS. 15A to 15E show a dark field image of an atom mapping, a yttrium atom map, an aluminum atom map, an oxygen atom map and a fluorine atom map, respectively, at an interface area by EDX.

Figure 15A:
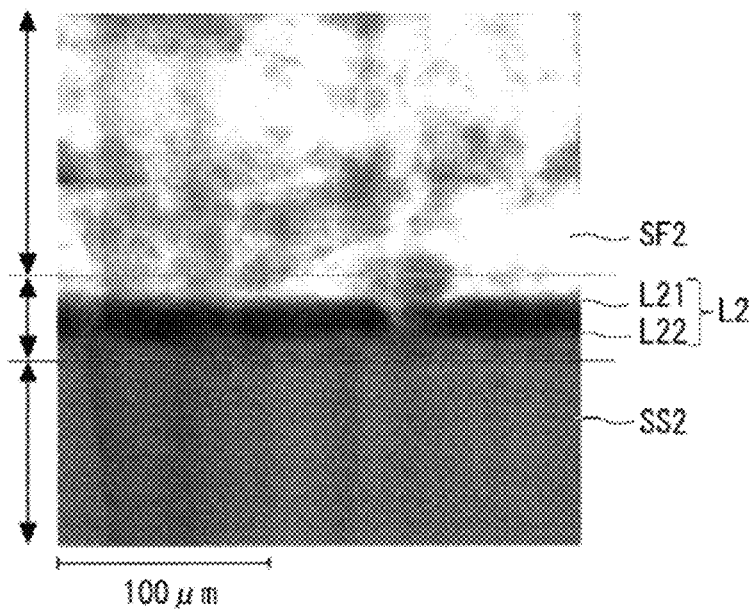
FIG. 15A is a dark field image of an interface area by EDX in Example 5.

As shown in FIG. 15A, the interface layer L2 at the substrate side includes a first layer L21 and a second layer L22 that is disposed closer to the substrate SS2 than the first layer L21.

Figure 15B:
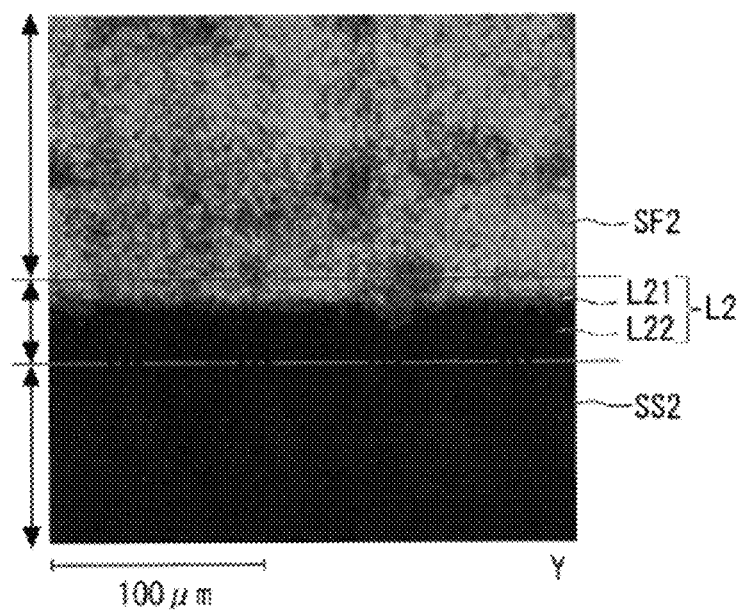
FIG. 15B is an yttrium (Y) atom map of an interface area by EDX in Example 5.
Figure 15C:
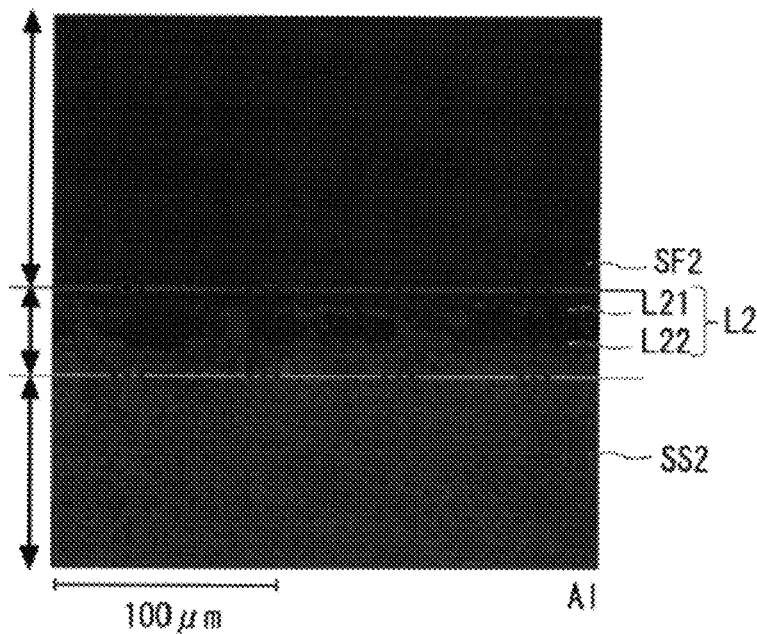
FIG. 15C is an aluminum (Al) atom map of an interface area by EDX in Example 5.
Figure 15D:
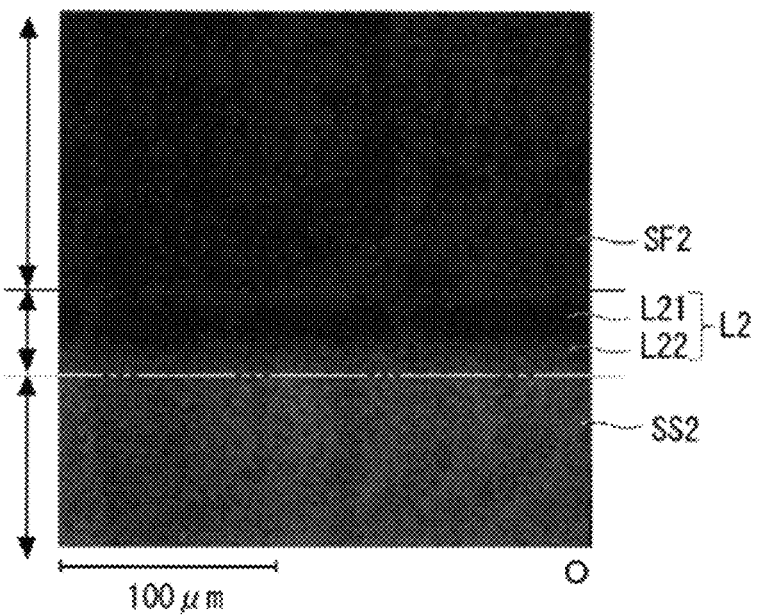
FIG. 15D is an oxygen (O) atom map of an interface area by EDX in Example 5.
Figure 15E:
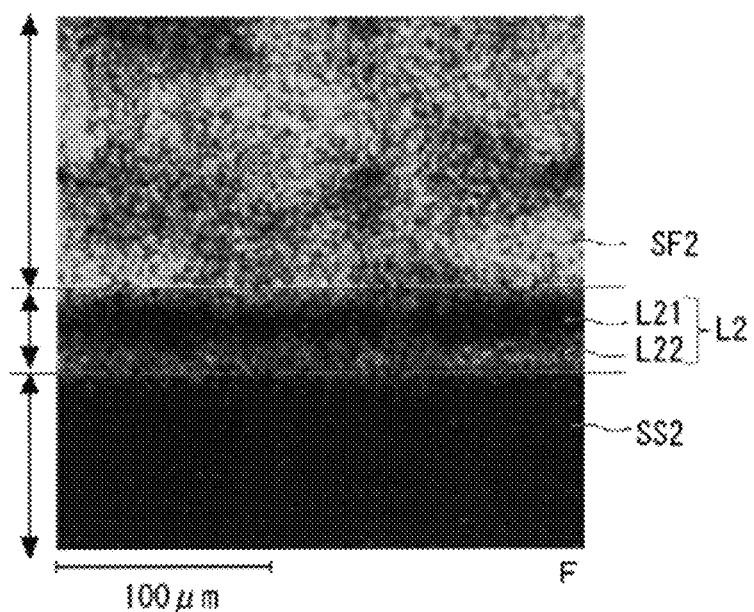
FIG. 15E is a fluorine (F) atom map of an interface area by EDX in Example 5.

As shown in FIGS. 15B and 15C, the first layer L21 includes yttrium (Y) and aluminum (Al). As shown in FIGS. 15C, 15D and 15E, the second layer L22 includes aluminum (Al), fluorine (F) and oxygen (O). Thus, the interface layer L2 at the substrate side includes yttrium (Y) and fluorine (F). The substrate SS2 includes α-$Al_2O_3$, and thus does not include yttrium (Y) or fluorine (F). The surface layer SF2 has a particle that includes $Y_5O_4F_7$. Thus, in step ST3 of FIG. 3, yttrium (Y) and fluorine (F) in the interface layer L2 at the substrate side seem to have permeated into the substrate SS2 together with oxygen (O), when the aerosolized raw material powder is sprayed onto the substrate SS2 and the $Y_5O_4F_7$ particle collides with the substrate SS2. The second layer L22 that includes oxygen (O) and fluorine (F) is disposed closer to the substrate SS2 than the first layer L21 that includes yttrium (Y). Each of oxygen (O) and fluorine (F) atoms has an atomic weight that is less than that of yttrium (Y), and thus in step ST3, oxygen (O) and fluorine (F) may have diffused deeper into the substrate SS2 than yttrium (Y). That is, yttrium (Y), oxygen (O) and fluorine (F) atoms may have diffused at an interface area between the substrate SS2 and the surface layer SF2.

An adhesion force between the substrate SS2 and the surface layer SF2 was detected by a stud pull test. As shown in table 3, an adhesion force of Example 5 is about 54.2 MPa. The strong adhesion force may be due to the mixture of atoms at the interface area between the substrate SS2 and the surface layer SF2.

Deposition Mechanism

Figure 16:
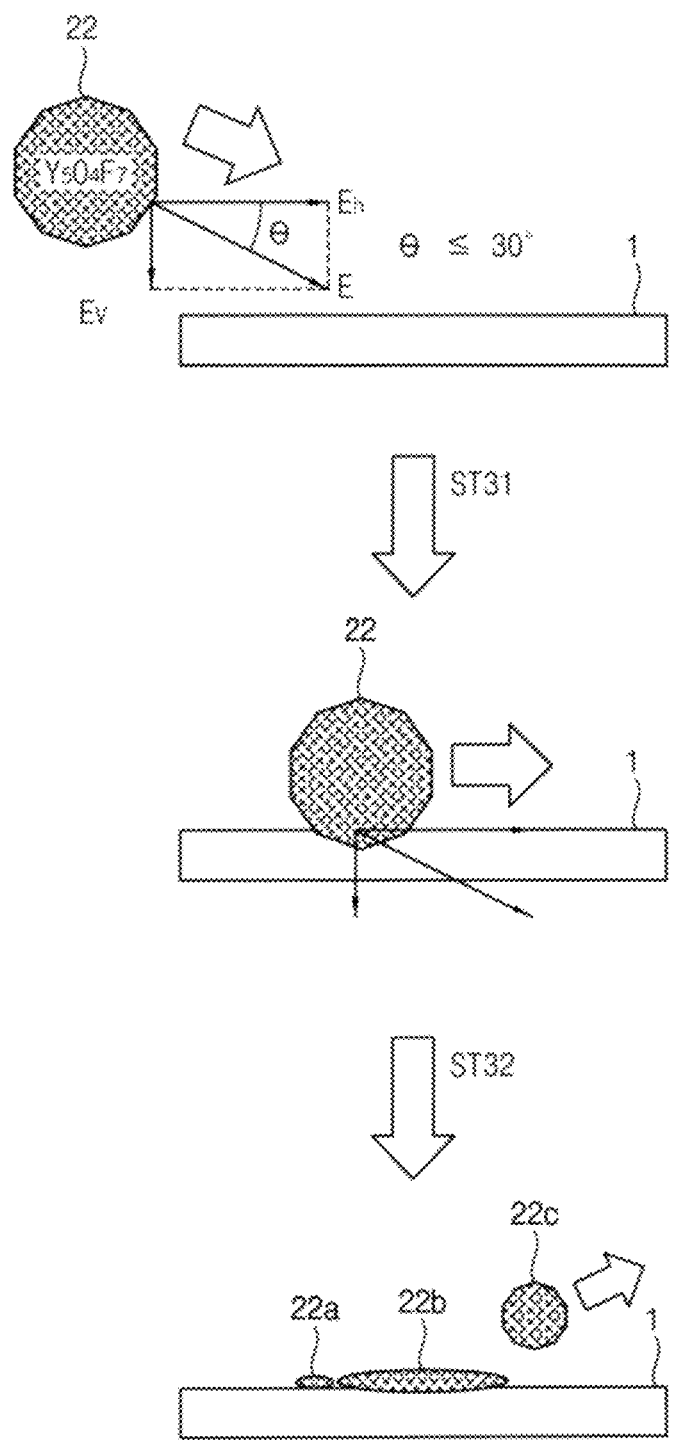
FIG. 16 is a schematic diagram that illustrates a mechanism for forming a surface layer by a manufacturing method in accordance with exemplary embodiments.

Referring to FIG. 16, mechanism for forming a surface layer in step ST3 of FIG. 3 is described.

In step ST3, in an embodiment, the aerosolized raw material powder is sprayed through the nozzle onto plane 1a of the member 1. As shown in FIG. 16, a $Y_5O_4F_7$ particle 22 moves straight in a direction that has an angle with respect to the plane 1a of the member 1, and collides with the member 1 (step ST31). A particle incident angle θ that is formed by an imaginary axis along the straight movement direction of the particle 22 and the plane 1a is greater than 0 degrees and equal to or less than about 30 degrees. In addition, the imaginary axis along the straight movement direction extends in the same direction as the spray axis of the nozzle.

In an embodiment, when the particle 22 collides with the plane 1a of the member 1, the particle 22 moves along the plane 1a, and may break (step ST32).

In an embodiment, broken parts 22a and 22b from the particle 22 may attach themselves to the plane 1a and remain. Another part 22c of the particle 22 may scatter from the plane 1a away from the member 1.

In an embodiment, after the particle 22 collides with the plane 1a, the particle 22 may contact the plane 1a and move along the plane 1a, and thus may receive a frictional force from the plane 1a. Thus, it may receive a shear force along the plane 1a. The particle 22 may be broken by the plane 1a, to be divided into separate parts. Some of the broken parts of the particle 22 may attach onto the plane 1a, and other of the broken parts of the particle 22 may scatter from the plane 1a. Some of the broken parts of the particle 22 may partially permeate or diffuse into an inside of the member 1.

Related Arts

Figure 21:
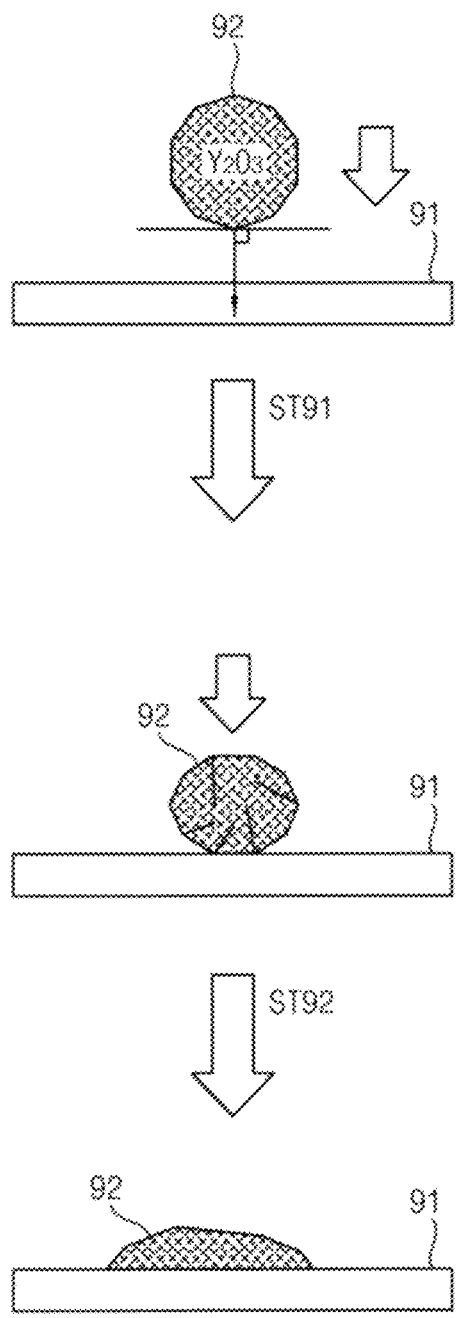
FIG. 21 is a schematic diagram that illustrates a mechanism for forming a surface layer by a related art aerosol deposition method.

An aerosol deposition method is related. As shown in FIG. 21, a plurality of particles 92 that include $Y_2O_3$ are sprayed in a vertical direction substantially perpendicular onto a substrate 91 (step ST91). The $Y_2O_3$ particles 92 collide with the substrate, and plastically deform (step ST92). The $Y_2O_3$ particles 92 harden, and are deposited on the substrate 91. Steps ST91 and ST92 may be performed on the $Y_2O_3$ particles 92 to form a surface layer.

A particle that includes $Y_5O_4F_7$ is softer than a $Y_2O_3$ particle, and is not easily broken. Thus, when the particle 92 includes $Y_5O_4F_7$, the surface layer tends to be compact powder, not a dense film.

Evaluation: Plasma Tolerance

An experiment for evaluating plasma tolerance of examples will be described with reference to FIGS. 17 to 20D.

48) A member of Example 14 is substantially the same as a member of Example 5, except for the time for forming a layer and the size of the substrate. The layer formation time was 225 min and the size of the substrate was 25 mm×25 mm in the member of Example 14.

A member of Comparative Example 3 is substantially the same as a member of Example 14, except for the raw material powder and the particle incident angle θ. The raw material powder included a plurality of particles that include $Y_2O_3$, and the particle incident angle θ was about 90 degrees. The surface layer of a member of Comparative Example 3 included a plurality of particles that include $Y_2O_3$. A member of Comparative Example 4 is substantially the same as a member of Example 14 and Comparative Example 3, except that it does not include a surface layer. A member of Comparative Example 4 was a substrate that includes $Al_2O_3$.

Figure 17:
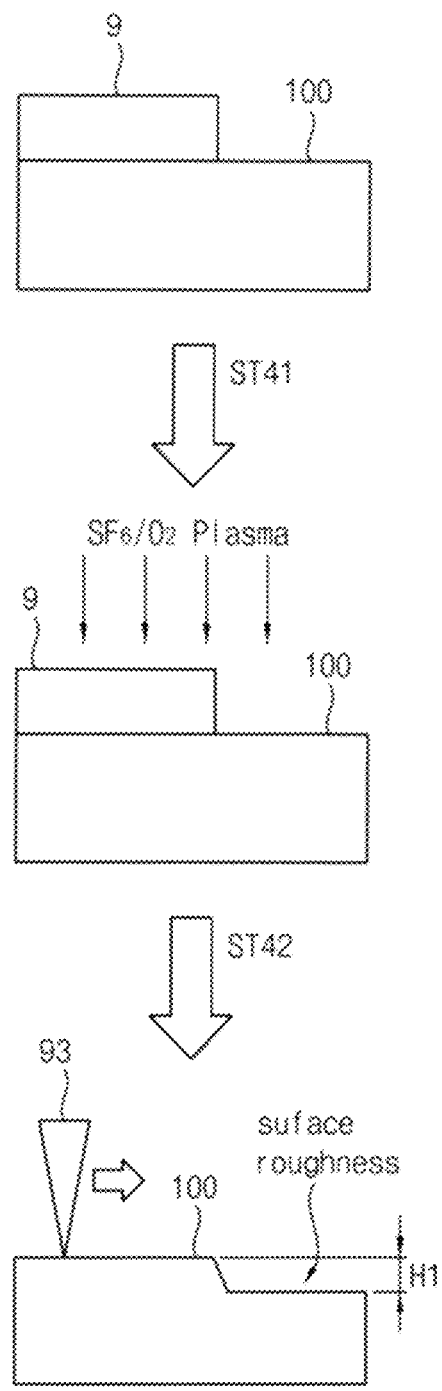
FIG. 17 is a schematic diagram that illustrates a method of a plasma irradiation experiment.

An plasma irradiation experiment was performed on members of Example 14 and Comparative Examples 3 and 4. In the plasma irradiation experiment, mirror polishing was performed on the member 100 to a thickness of about 10 um. FIG. 17 is a schematic diagram that illustrates a method of a plasma irradiation experiment. As shown in FIG. 17, a portion of the member 100 was covered with a thin plate glass 9. Plasma was irradiated onto the member 100 using a plasma reaction ion etching apparatus while providing an $SF_6/O_2$ gas thereon (step ST41). After removing the thin plate glass 9, a surface roughness of the member 100 was detected using a stylus 93 of a surface roughness and shape detector (step ST42). A surface of the member 100 has a height difference H1 according to positions thereof.

Experiment conditions for the plasma irradiation experiment were as follows: pressure in the chamber was 3.7 Pa; flow rate of $SF_6$ gas was 200 SCCM; irradiation time was 0 hours, 2 hours and 6 hours; frequency was 13.56 MHz; bias power was 13 W; and ICP power was 600 W.

Figure 18:
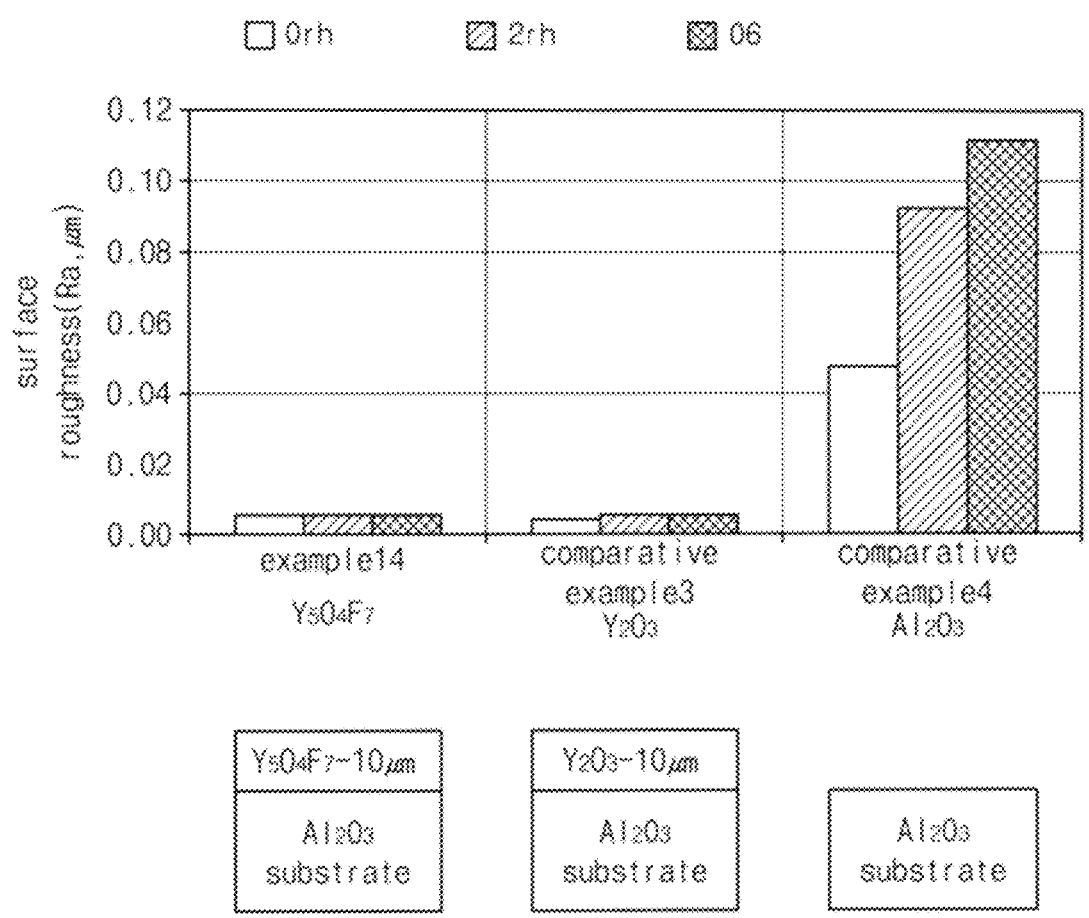
FIG. 18 is a graph that illustrates changes of surface roughnesses of the plasma irradiation experiment in Example 14 and Comparative Examples 3 and 4.

Changes of a surface roughness in the plasma irradiation experiment are shown in FIG. 18. FIG. 18 is a graph that illustrates changes of the surface roughness in the plasma irradiation experiment of Example 14 and Comparative Examples 3 and 4. As shown in FIG. 18, the surface roughness in Example 14 changes from 0.0050 um to 0.0051 um by increments of 0.0001 um before and after the plasma irradiation experiment. The surface roughness in Comparative Example 3 changes from 0.0042 um to 0.0052 um by increments of 0.0010 um before and after the plasma irradiation experiment. The surface roughness in Comparative Example 4 changes from 0.040 um to 0.0110 um by 0.070 um before and after the plasma irradiation experiment. The change of surface roughness in Example 14 is less than the change of surface roughness in Comparative Example 4. The change of surface roughness in Example 14 is substantially the same as or slightly less than the change of surface roughness in Comparative Example 3. If the change of the surface roughness is small, it is believed that the plasma tolerance is good. According to the surface roughness, a surface layer that has particles that include $Y_5O_4F_7$ has substantially the same or better plasma tolerance as a surface layer that has particles that include $Y_2O_3$.

Results of the observation of cross-sections of members in Example 14 and Comparative Example 3 after 6 hours of plasma irradiation using TEM and EDX will now be described.

Figure 19:
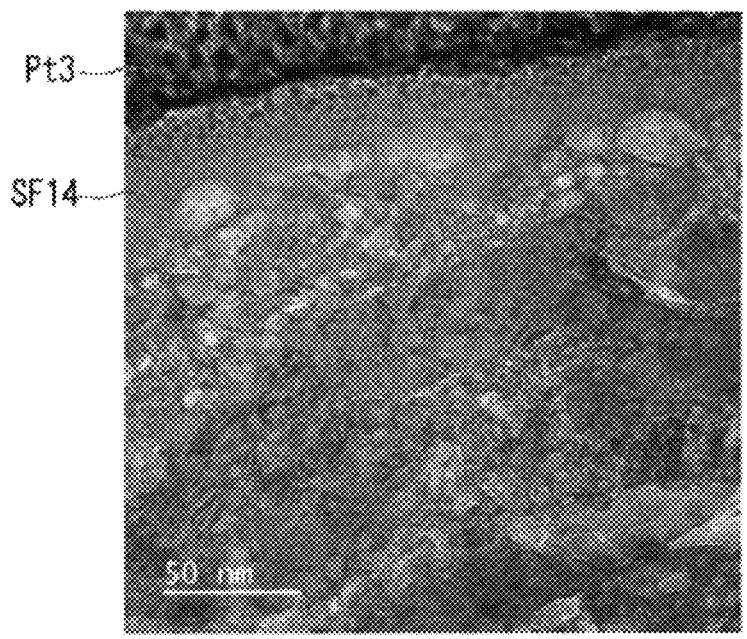
FIG. 19 is a TEM photo of a cross-section of a member in Example 14.
Figure 20A:
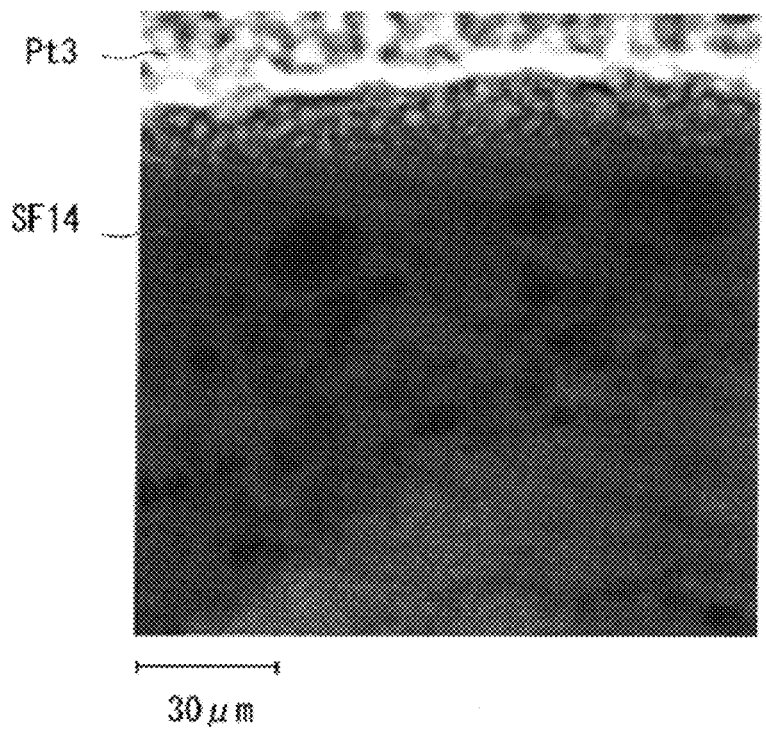
FIG. 20A is a dark field image of an interface area by EDX in Example 14.
Figure 20B:
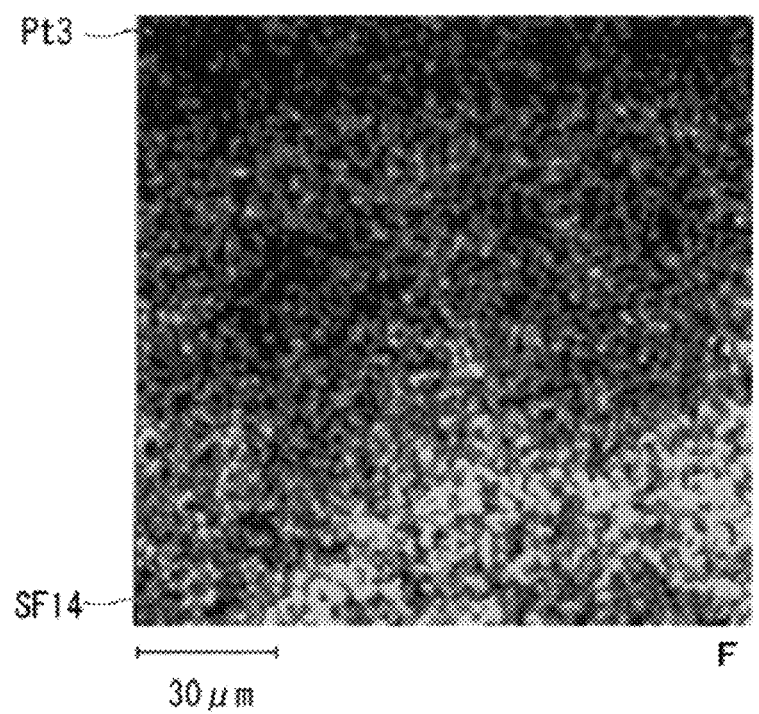
FIG. 20B is a fluorine (F) atom map of an interface area by EDX in Example 14.
Figure 20C:
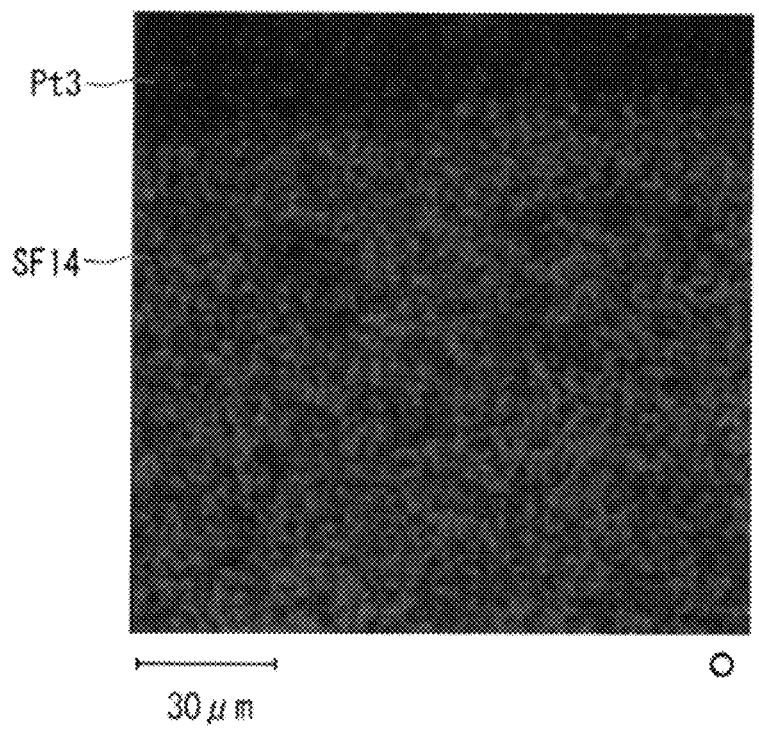
FIG. 20C is an oxygen (O) atom map of an interface area by EDX in Example 14.
Figure 20D:
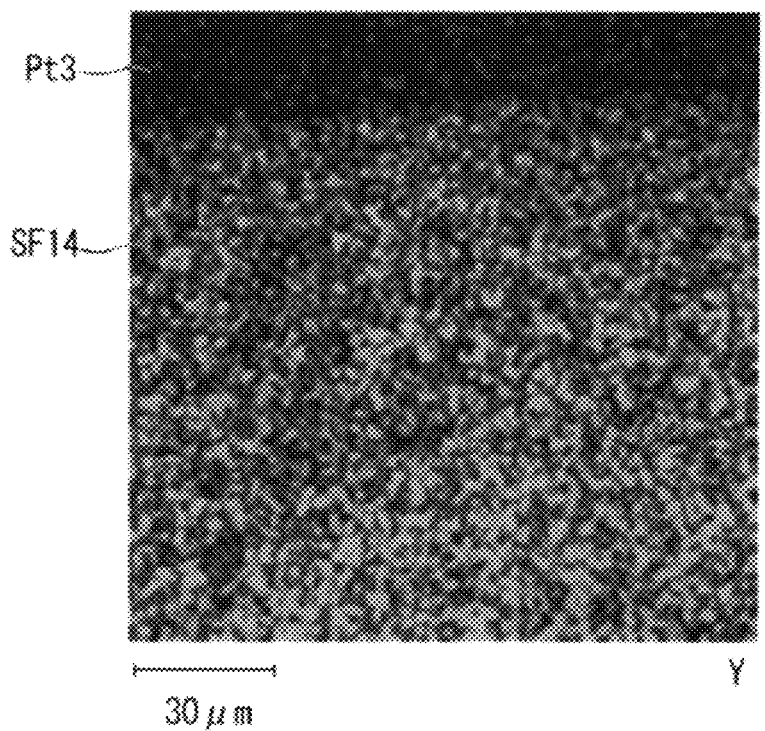
FIG. 20D is an yttrium (Y) atom map of an interface area by EDX in Example 14.

A TEM photo of the cross-section of a member in Example 14 is shown in FIG. 19. Atom mappings by EDX at an interface area in Example 5 are shown in FIGS. 20A to 20D. A platinum protection layer Pt3 is formed on a surface layer SF14 of Example 14.

In particular, FIGS. 20A to 20D show a dark field image of an atom mapping, a fluorine atom map, an oxygen atom map, and a yttrium atom map, respectively, at an interface area in Example 14 by EDX.

Figure 22:
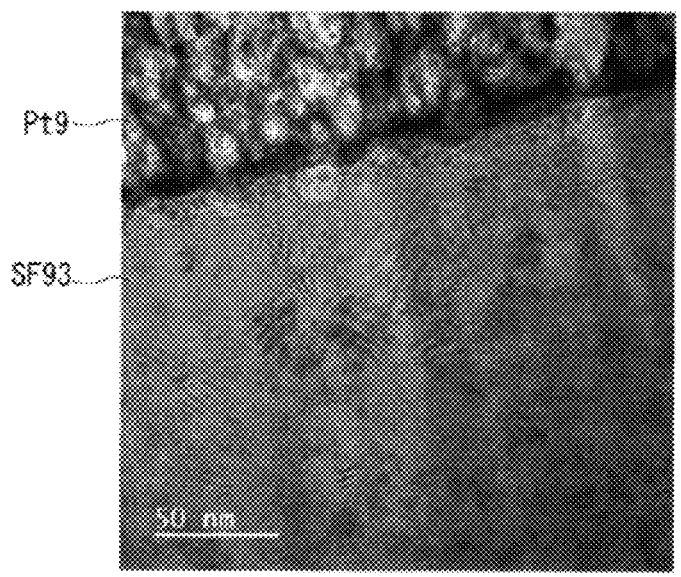
FIG. 22 is a TEM photo of a cross-section of a member in Comparative Example 3.

A TEM photo of a cross-section of a member in Comparative Example 3 is shown in FIG. 22. Atom mappings by EDX at an interface area in Comparative Example 3 are shown in FIGS. 23A to 23D. A platinum protection layer Pt9 is formed on a surface layer SF93 of Comparative Example 3.

In particular, FIGS. 23A to 23D show a dark field image of an atom mapping, a fluorine atom map, an oxygen atom map, and a yttrium atom map, respectively, at an interface area in Comparative Example 3 by EDX.

Figure 23A:
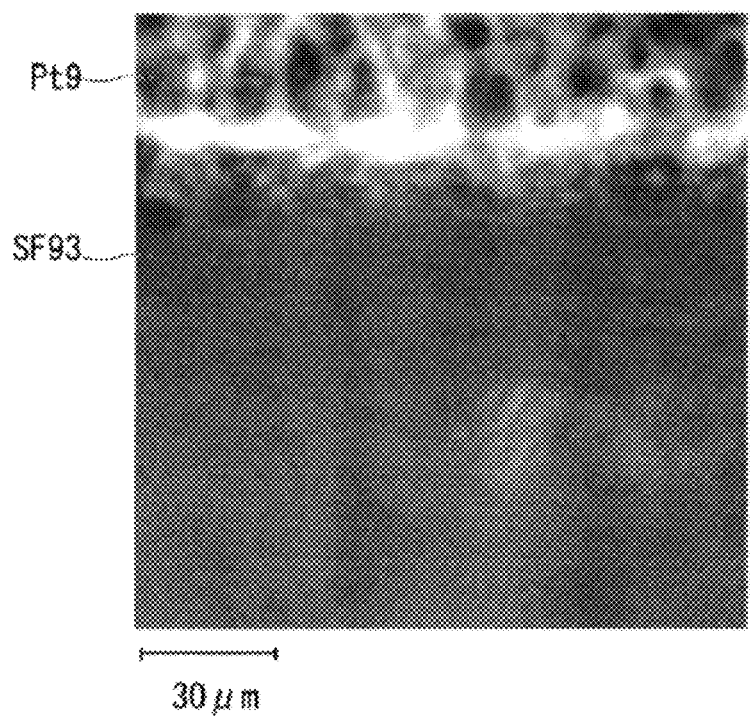
FIG. 23A is a dark field image of an interface area by EDX in Comparative Example 3.
Figure 23B:
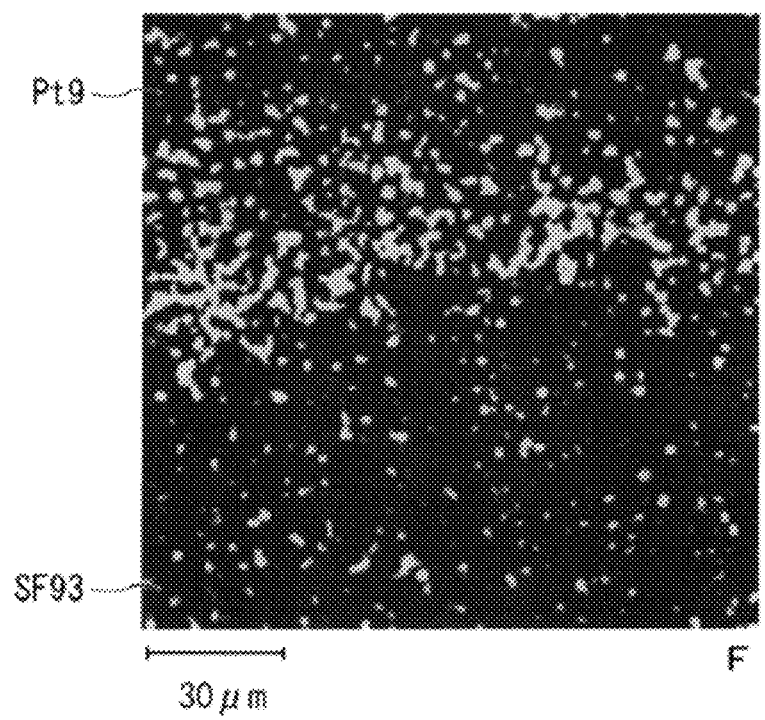
FIG. 23B is a fluorine (F) atom map of an interface area by EDX in Comparative Example 3.
Figure 23C:
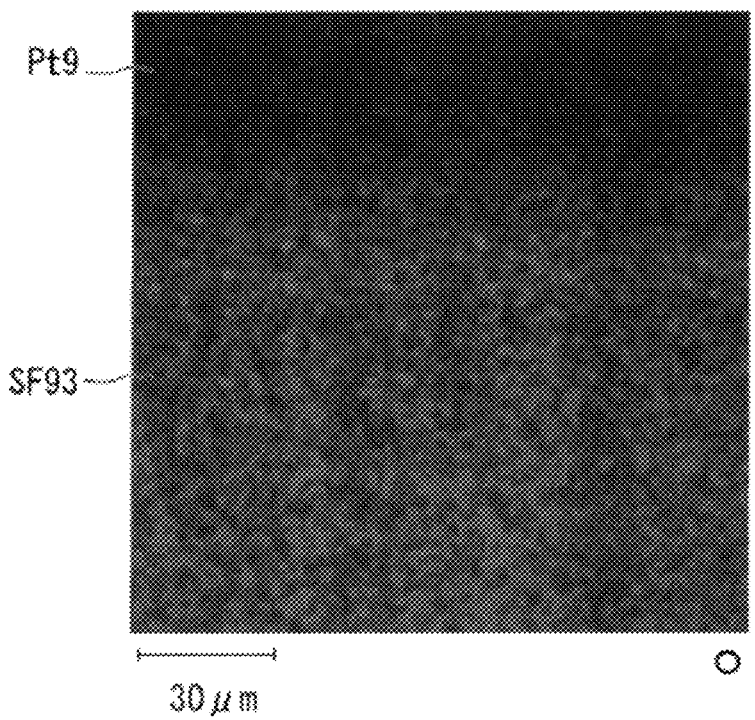
FIG. 23C is an oxygen (O) atom map of an interface area by EDX in Comparative Example 3.
Figure 23D:
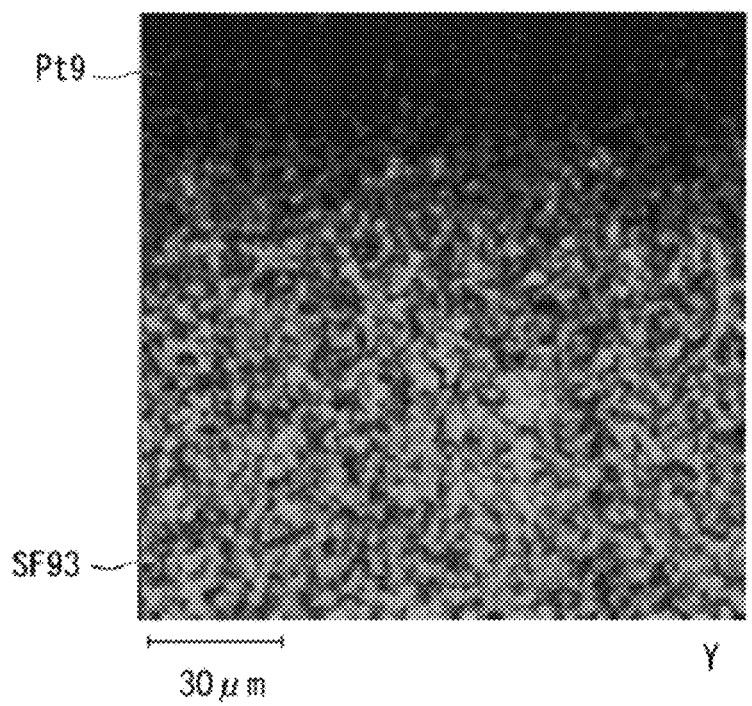
FIG. 23D is an yttrium (Y) atom map of an interface area by EDX in Comparative Example 3.

As shown in FIGS. 22, and 23A to 23D, a member of Comparative Example 3 includes a surface layer SF93. As shown in FIG. 23B, the surface layer SF93 includes fluorine. As mentioned above, before the plasma irradiation experiment, the surface layer SF93 included a plurality of $Y_2O_3$ particles, and thus did not include fluorine (F). However, after the plasma irradiation experiment, the surface layer SF93 includes fluorine (F). The fluorine (F) in the surface layer SF93 seems to derive from a fluorine radical generated outside of the Comparative Example 3 member, e.g., by plasma irradiation. That is, $Y_2O_3$ seems to be transformed by receiving fluorine (F).

As shown in FIGS. 19 and 20A to 20D, the surface layer SF14 in Example 14 includes fluorine (F), because the surface layer SF14 included a plurality of $Y_5O_4F_7$ particles. Thus, the surface layer SF14 in Example 14 was not altered by, e.g., a fluorine radical, and thus may have better plasma tolerance than the surface layer in Comparative Example 3.

Examples using $SiO_2$ as members thereof will now be described.

As shown in table 2, $SiO_2$ was used as members of Examples 6 to 8. The manufacturing conditions of Examples 6 to 8 were the same as those of Examples 4 and 5 and Reference Example, except for the substrate material, the particle incident angle θ, and the layer formation time. Even the particle incident angle θ and the layer formation time of Examples 6 to 8 were not much different from those of Examples 4 and 5 and Reference Example.

The surface layers of Examples 6 to 8 were dense films. Thus, even though $SiO_2$ was used as the members, dense films were formed.

As shown in table 3, I (1 0 0)/I (1 5 1) of Examples 6 to 8 are higher than I (1 0 0)/I (1 5 1) (=0.045) of the raw material powder. I (0 10 0)/I (1 5 1) of Examples 6 to 8 are higher than I (0 10 0)/I (1 5 1) (=0.206) of the raw material powder, Thus, even if $SiO_2$ is used as the members, the crystal orientations thereof tend to be different from those of the raw material powder.

Pressure in the Layer Formation Chamber: 80 Pa to 245 Pa

As shown in table 2, the pressure in the layer formation chamber was 80 Pa to 245 Pa in Examples 9 to 11. The manufacturing conditions in Examples 9 to 11 are the same as those of Example 5, except for the layer formation chamber pressure.

The surface layers in Examples 9 to 11 were dense films. Thus, even though the pressure of the layer formation chamber is 80 Pa to 245 Pa, dense films were formed.

As shown in table 3, I (1 0 0)/I (1 5 1) of Examples 9 to 1 are greater than I (1 0 0)/I (1 5 1) (=0.045) of the raw material powder. I (0 10 0)/I (1 5 1) of Examples 9 to 11 are less than I (0 10 0)/I (1 5 1) (=0.206) of the raw material powder. Thus, even though the pressure of the layer formation chamber is 80 Pa to 245 Pa, the crystal orientation tends to differ from that of the raw material powder.

Particle Velocity: 18.5 m/Sec to 55.6 m/Sec

Examples will be described in which the particle velocity changes in a given range.

As shown in table 2, the particle velocity of Examples 12 and 13 ranged from 18.5 m/sec to 55.6 m/sec. The manufacturing conditions of Examples 12 and 13 are the same as those of Example 5, except for the layer formation pressure.

The surface layers in Examples 5, 12 and 13 were dense films. Thus, even though the particle velocity is 18.5 m/sec to 55.6 m/sec, dense films were formed. When the particle velocity is in a range from about 15 m/sec to about 60 m/sec, a dense film is formed.

As shown in table 3, I (1 0 0)/I (1 5 1) of Examples 5, 12 and 13 were greater than I (1 0 0)/I (1 5 1) of the raw material powder. I (0 10 0)/I (1 5 1) of Examples 9 to 11 were greater than I (0 10 0)/I (1 5 1) of the raw material powder. Thus, even though the particle velocity ranges from 18.5 mi/sec to 55.6 m/sec, the crystal orientation tends to differ from that of the raw material powder.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of embodiments of the present inventive concept. Accordingly, all such modifications are intended to be included within the scope of embodiments of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A manufacturing apparatus for a member, the manufacturing apparatus comprising:
    a chamber that includes a base material structure, wherein the base material structure includes a planar surface, and a surface layer formed on the planar surface; and
    a nozzle disposed in the chamber,
    wherein the nozzle is open inside of the chamber,
    wherein the nozzle sprays a raw material powder onto the planar surface to form the surface layer, and
    wherein a particle incident angle formed by a spray axis of the raw material powder and the planar surface is equal to or less than 30 degrees,
    wherein the surface layer includes a particle that includes Y—O—F,
    wherein the base material structure includes an interface layer in contact with the surface layer and a base body in contact with the interface layer thereof, wherein the interface layer of the base material structure includes a first layer and a second layer,
    wherein the interface layer of the base material structure includes fluorine,
    wherein the second layer is closer to the base body than the first layer, and
    wherein the second layer has a fluorine content that is greater than that of the first layer.

2. The manufacturing apparatus of claim 1, wherein
    an X-ray diffraction peak intensity ratio of a (1 5 1) plane with respect to a (1 0 0) plane of the surface layer is greater than
    an X-ray diffraction peak intensity ratio of a (1 5 1) plane with respect to a (1 0 0) plane of a raw material powder of the surface layer or of ICDD data of a raw material.

3. The manufacturing apparatus of claim 2, wherein the surface layer has a crystalline orientation greater than that of the raw material powder.

4. The manufacturing apparatus of claim 1,
    wherein the particle that includes Y—O—F has an average diameter from about 10 nm to about 100 nm, and
    wherein the surface layer has a porosity of equal to or less than about 2%.

5. The manufacturing apparatus of claim 1,
    wherein the Y—O—F has a rhombohedral crystal structure that includes one of $Y_5O_4F_7$, $Y_1O_{0.826}F_{1.348}$, $Y_6O_5F_8$, $Y_7O_6F_9$, or $Y_{17}O_{14}F_{23}$.

6. The manufacturing apparatus of claim 1,
    wherein the base material structure includes one of a ceramic, a metal, a glass, or an organic compound.

* * * * *